(12) United States Patent
Komoike

(10) Patent No.: US 6,553,528 B1
(45) Date of Patent: *Apr. 22, 2003

(54) TEST CIRCUIT FOR SEMICONDUCTOR INTEGRATED CIRCUIT

(75) Inventor: Tatsunori Komoike, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/428,486

(22) Filed: Oct. 28, 1999

(30) Foreign Application Priority Data

Jun. 22, 1999 (JP) .............................. 11-175986

(51) Int. Cl.⁷ ......................... G01R 31/28; G06F 11/00
(52) U.S. Cl. ...................................................... 714/736
(58) Field of Search ................................. 714/736, 735

(56) References Cited

U.S. PATENT DOCUMENTS

| | | | |
|---|---|---|---|
| 4,313,200 A | * | 1/1982 | Nishiura ..................... 714/736 |
| 4,583,041 A | * | 4/1986 | Kimura ....................... 714/735 |
| 5,329,538 A | * | 7/1994 | Kawano et al. ............. 714/812 |
| 5,432,797 A | * | 7/1995 | Takano ....................... 714/718 |
| 5,579,251 A | * | 11/1996 | Sato ............................ 702/117 |
| 5,668,819 A | * | 9/1997 | Fukushima ................. 714/736 |
| 5,701,309 A | * | 12/1997 | Gearhardt et al. .......... 714/736 |
| 5,864,565 A | * | 1/1999 | Ochoa et al. ............... 714/735 |
| 5,883,809 A | * | 3/1999 | Sullivan et al. ................ 716/3 |
| 5,996,098 A | * | 11/1999 | Takano ....................... 714/723 |
| 2001/0052097 A1 | * | 12/2001 | Miura ......................... 714/744 |

FOREIGN PATENT DOCUMENTS

| | | |
|---|---|---|
| JP | 6-349299 | 12/1994 |
| JP | A-7-57499 | 3/1995 |
| JP | 7-141900 | 6/1995 |
| JP | 10-21150 | 1/1998 |

* cited by examiner

Primary Examiner—Albert Decady
Assistant Examiner—Joseph D. Torres
(74) Attorney, Agent, or Firm—Burns, Doane, Swecker & Mathis, LLP

(57) ABSTRACT

In a test circuit for a semiconductor integrated circuit, a counter circuit generates a control signal based on a comparison result between test results and expected data from a comparison circuit and outputs the control signal to a tri state buffer. The tri state buffer operates based on the received control signal. The counter circuit outputs the generated control signal to the tri state buffer in order that the tri state buffer outputs the test result to the outside of the test circuit only when the test results are not equal to the expected data.

12 Claims, 22 Drawing Sheets

OPERATION OF CIRCUIT 22 AT E = 'h'

TEST CIRCUIT FOR SEMICONDUCTOR INTEGRATED CIRCUIT

BACKGROUND OF THE INVENTION

1. Field of the Invention

The present invention relates to a test circuit for testing the operation of functional modules (or test object circuits) such as a large scaled DRAM (Dynamic Random Access Memory) module, a CPU module, other type logic modules and small scaled memory module, and the like forming a semiconductor integrated circuit such as a LSI.

2. Description of the Related Art

One chip LSIs on which plural functional modules such as a large scaled DRAM module, a CPU module, other type logic/small scaled memory modules, and the like are mixed and mounted have been developed and manufactured.

In general, the test time required for operational test of the various functional modules mounted on the LSI is more than the sum of the test time required for each functional module. Because the various functional modules are mounted on the current one chip LSI when compared with another conventional LSI, the test time for the current one chip LSI is greater than that of the conventional LSI.

In order to reduce the total test time, it is preferred that the test operations of the functional modules mounted on the one chip LSI are executed in parallel so far as conditions permit. However, the total test time of the one chip LSI depends on the functional module that requires the maximum test time.

On the other hand, specialized testers are also used for the memory module and the logic module, respectively. It is therefore impossible to perform the test operation of the functional modules in parallel while the test operation of the large scaled DRAM is executed. On the contrary, it is also impossible to perform the test operation of the large scaled DRAM in parallel while the test operation of the functional modules is executed.

To use the specialized tester for each functional module increases the total test time of the one chip LSI. In order to eliminate this drawback, there is a method to introduce a new common tester having a common specification for the various module. However, because enormous expenses are necessary for this conventional method, the cost of the one chip LSI is thereby increased.

In general, although it is required to reduce the manufacturing cost of the LSI so far as conditions permit in spite of the type of the tester to be used, the most effective method to reduce the total cost of the manufacturing for LSI chip of the semiconductor integrated circuit is to reduce the test time of the modules mounted on the LSI chip.

FIG. 1 is a block diagram showing a test circuit performing a conventional test method for the semiconductor integrated circuit. In FIG. 1, the reference number 210 designates a semiconductor chip or a LSI chip, 211 denotes one of various kinds of modules as an object circuit for test, and 212 indicates a selector through which test results are transferred to the outside of the semiconductor chip 210.

The object circuit 211 for test can not output test results Pout [127:0]. at one time to the outside of the semiconductor chip 210 because of a pin-neck. Accordingly, the selector 212 selects test results per 32 bit and transfers them to the outside of the semiconductor chip 210. This conventional test method shown in FIG. 1 requires the test time that is four times as long as the test time in which all of the test results Pout [127:0] are transferred to the outside of the semiconductor chip 210 at one time.

The test input data In [127:0] as a test input pattern are provided to the object circuit 211 and then the output data (or test results) Out [31:0] are transferred to the outside of the semiconductor chip 210. In this case, when the combination (a, b) of both control signals a and b is (0, 0), namely (a, b)=(0, 0), the selector 212 selects the output data Pout ([127:96]. This selected output data Pout [127:96] are transferred as output data Out [31:0] to the outside of the semiconductor chip 210.

When the combination (a, b) of both control signals a and b is (0, 1), namely (a, b)=(0, 1), the selector 212 selects the output data Pout [95:64]. This selected output data Pout [95:64] are transferred as output data Out [31:0] to the outside of the semiconductor chip 210. In addition, when the combination (a, b) of both control signals a and b is (1, 0), namely (a, b)=(1, 0), the selector 212 selects the output data Pout [63:32]. This selected output data Pout [63:32] are transferred as output data Out [31:0] to the outside of the semiconductor chip 210. In the same manner, when the combination (a, b) of both control signals a and b is (1, 1), namely (a, b)=(1, 1), the selector 212 selects the output data Pout [31:0]. This selected output data Pout [31:0] are transferred as output data Out [31:0] to the outside of the semiconductor chip 210.

The output data Out [31:0] are compared with the expected data that have been prepared in advance in order to check whether the semiconductor chip 210 is a defective device or not. The output data (or the test results) Out [31:0] that are different from the expected data indicate the object circuit 211 has one or more structural defects. For example, when the output data Pout [31:0] are h'0000 . . . 0001' and the expected data are h'0000 . . . 0000, the output data item Pout [0] is a wrong data item. Accordingly, the analysis of the failure of the semiconductor chip 210 is performed around the output data item Pout [0].

FIG. 2 is a block diagram showing a test circuit performing another conventional test method for a semiconductor integrated circuit. In FIG. 2, the reference number 211 designates the object circuit for test that has been shown in FIG. 1 as the object module for test. The reference number 220 denotes a semiconductor chip, 212 indicates a selector for selecting test results and transfer the selected test results to the outside of the semiconductor chip 220, and 223 designates a comparison circuit. The selector 212 has the same configuration of the selector 212 shown in FIG. 1.

In the conventional test method shown in FIG. 2, the test results are compared with the expected data in the semiconductor chip 220. The comparison circuit 223 comprises exclusive OR gates where the test results obtained from the object circuit 211 for test are compared with the expected data Ex [127:0].

If the object circuit 211 for test has no-defect section, the output data Pout are completely equal to the expected data EX, and the comparison circuit 223 outputs the output signal ZO=0. In this conventional test method, the external tester (not-shown) can check the presence or the absence of the defect by referring the value of the output ZO from the comparison circuit 223. Therefore because the external tester does not require the receiving operation of the output data Pout transferred from the object circuit 211 and also does not check the output data Pout four times, the conventional test method shown in FIG. 2 can reduce the test time drastically.

However, although the conventional test method shown in FIG. 2 can check the presence or the absence of the defect in the object circuit 211, it can not indicate the defect section in the object circuit 211 for test. It is impossible to specify the position of the defect in the object circuit 211 for test.

Because the conventional test circuits for the semiconductor integrated circuit have the configurations described above, the conventional test method shown in FIG. 1 can get the information for indicating the defect section in the object circuit 211 for test and has the following drawback:

When the output data Pout [31:0] obtained from the object circuit for test are not equal to the expected data, only the output data Pout [31:0] are required and other output data Pout [127:32] are not required for the analysis of the test results. Accordingly, it will be of no use to output the other output data. This conventional test method shown in FIG. 1 requires a long test time. On the other hand, although another conventional test method shown in FIG. 2 can require only the minimum test time, it can not specify the position of the defect in the object circuit.

SUMMARY OF THE INVENTION

Accordingly, an object of the present invention is, with due consideration to the drawbacks of the conventional technique, to provide a test circuit for a semiconductor integrated circuit capable of outputting output data (or test results including disagreement information) only for specifying the position of a defect section obtained from an object circuit for test and capable of reducing a total test time.

In accordance with one aspect of the present invention, a test circuit for a semiconductor integrated circuit, comprises a plurality of comparison means for comparing test results transferred from an object circuit for operational test of the semiconductor integrated circuit with expected data that have been prepared in advance, a plurality of control means for generating a control signal that indicates whether or not the test results are outputted to outside based on comparison results transferred from each of the plurality of comparison means, and a plurality of selection means for selecting a part of the test results based on the control signal transferred from the plurality of control means. In the test circuit, each of the plurality of comparison means, the plurality of control means, and the plurality of selection means are incorporated in the test circuit per predetermined bits, and each of the plurality of control means generates the control signal based on the comparison result that indicates only when the test results are not equal to the expected data, and outputs the generated control signal to the corresponding selection means.

In accordance with a further aspect of the preferred embodiment, each of said plurality of control means generates said control signal based on said comparison result transferred from said corresponding comparison means that indicates only when said test results corresponding to each control means are equal to said expected data and outputs said control signal to said selection means corresponding to said control means in order to output said test results to the outside.

According to another aspect of the present invention, output pins of a semiconductor chip on which the test circuit and the semiconductor integrated circuit are divided into predetermined parts, and each of the plurality of comparison means, each of the plurality of control means, and each of the plurality of selection means are assigned to each part of the divided output pins.

In accordance with another aspect of the present invention, each of the plurality of control means in the test m; circuit comprises a plurality of flip flops and a plurality of logical circuits for generating the control signal that indicates whether or not the test results are outputted to the outside based on the comparison result transferred from the corresponding comparison means and outputs the control signal to the corresponding selection means.

In accordance with another aspect of the present invention, each of the plurality of control means in the test circuit is made up of a counter circuit comprising a plurality of flip flops and a plurality of logical circuits for generating the control signal that indicates whether or not the test results are outputted to the outside based on the comparison result transferred from the corresponding comparison means and outputs the control signal to the corresponding selection means.

In this embodiment, each of the plurality of flip flops operates based on a positive edge or a negative edge of a clock signal.

In this embodiment, input and output signals each having a same level are commonly used, and input and output signals each having an opposite level to each other are used through an inverter for inverting the level of the input and output signals having the opposite level in order to have a same level in the plurality of logical circuits making up each of the plurality of control means and in order to reduce the number of said logical circuits.

In accordance with another aspect of the present invention, each of the plurality of selection means in the test circuit comprises one of a tri state buffer and a selector.

In accordance with another aspect of the present invention, each of the plurality of selection means in the test circuit comprises a tri state buffer operable based on a high enable state or a low enable state.

In accordance with another aspect of the present invention, the test circuit further comprises a second selection means for generating a control signal that indicates only a case where the test results are completely equal to the expected data, and then outputs the generated control signal to outside.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

First Embodiment

Figure 1:
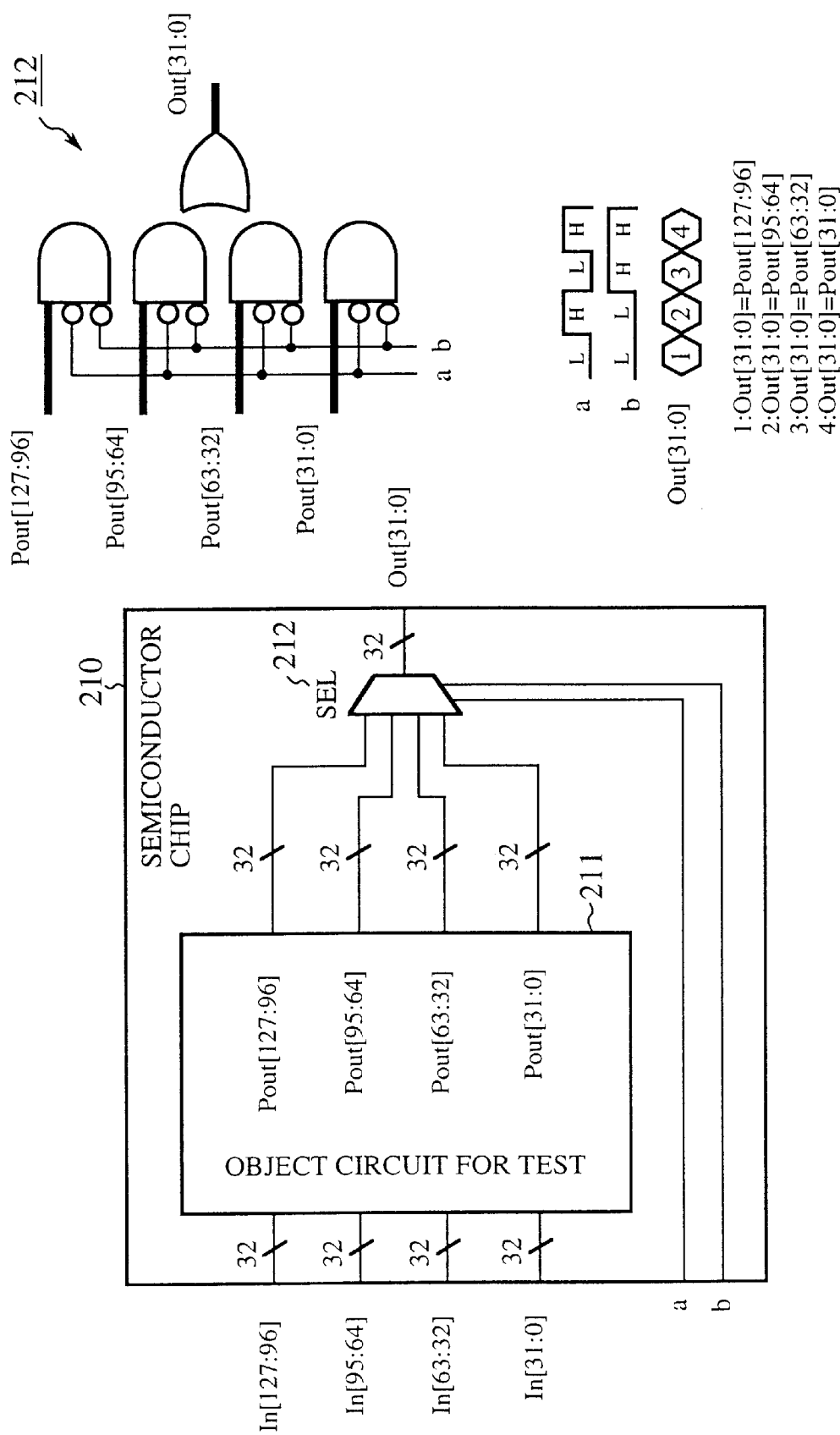
FIG. 1 is a block diagram showing a test circuit performing a conventional test method for the semiconductor integrated circuit.
Figure 2:
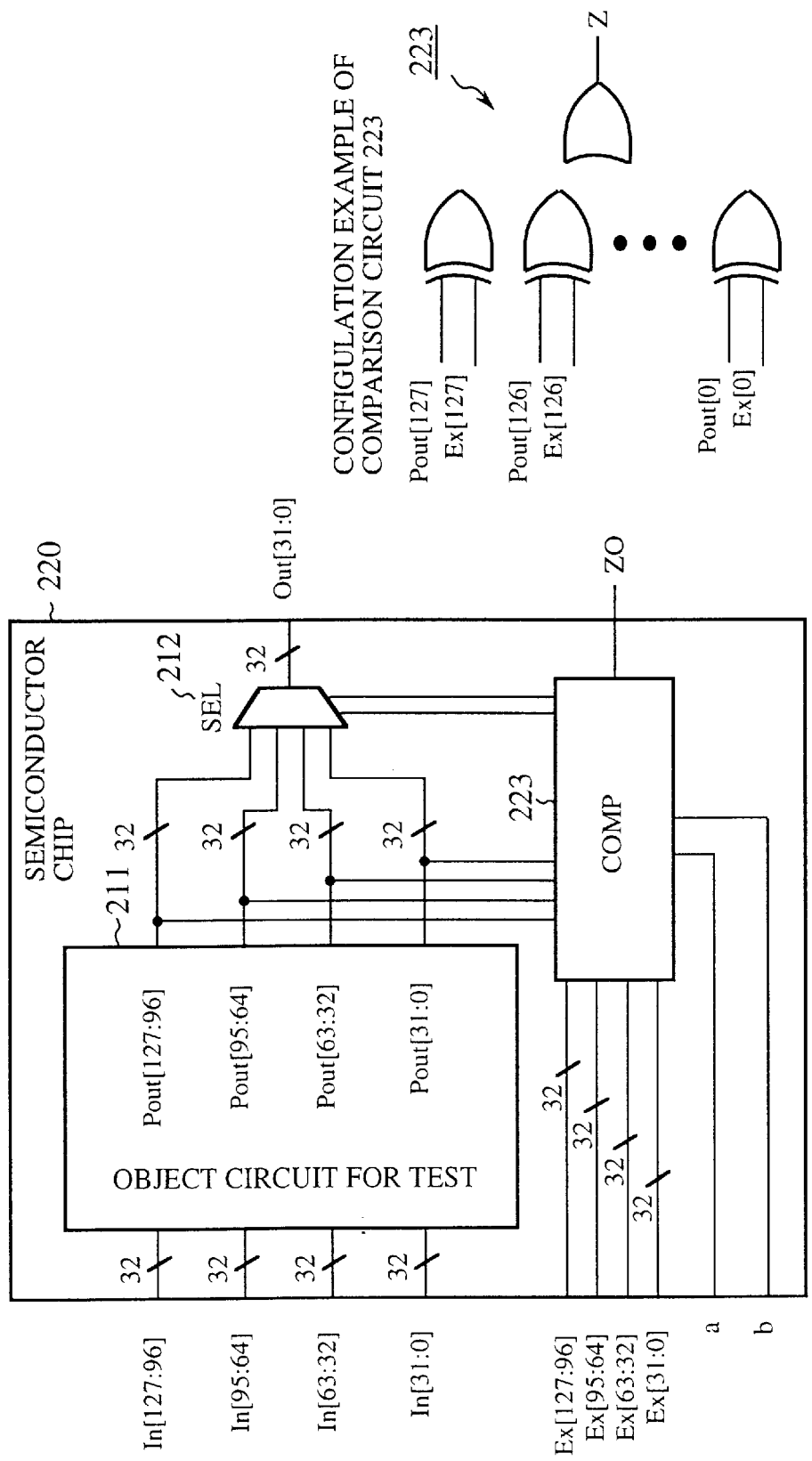
FIG. 2 is a block diagram showing a test circuit performing another conventional test method for a semiconductor integrated circuit.
Figure 3:
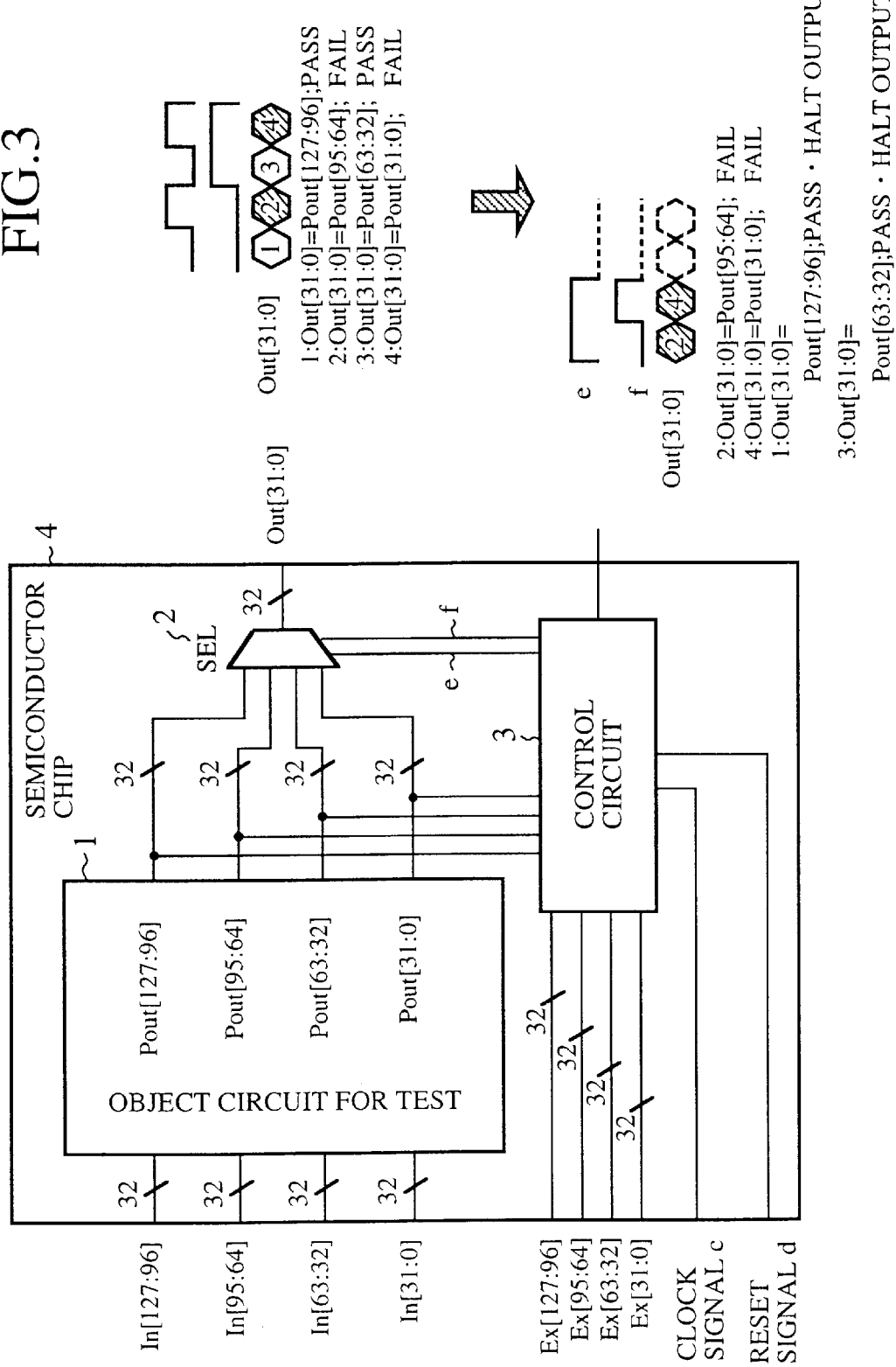
FIG. 3 is a schematic diagram of a test circuit incorporated in a semiconductor integrated circuit according to the present invention.

FIG. 3 is a schematic diagram of a test circuit incorporated in a semiconductor integrated circuit according to the present invention. In FIG. 1, the reference number 1 designates an object circuit for test such as a large scaled DRAM (Dynamic Random Access Memory) module, a CPU module, other type logic modules and small scaled memory module, and the like incorporated in a semiconductor integrated circuit such as a LSI. The reference number 2 denotes a selector for selecting a part of test results obtained from the object circuit 1 and then for outputting the selected data Out [31:0] to the outside of the semiconductor chip 4. The reference number 3 denotes a comparison control circuit, and the reference number 4 indicates the semiconductor chip on which the semiconductor integrated circuit including the object circuit 1 for test and the test circuit are mounted.

Next, a description will be given of the operation of the test circuit according to the present invention.

The selector 2 operates based on the level of a control signal e transferred from the comparison control circuit 3. For example, when the test results are not equal to expected data, the comparison control circuit 3 generates and then outputs the control signal e indicating the disagreement between the output data (re the test results) transferred from the object circuit for test and the expected data to the selector 3. When receiving the control signal e, the selector 2 selects only one part (regarding the data that are different from the expected data) of the output data Pout from the object circuit 1 and then outputs the selected data Pout to the outside of the semiconductor chip 4.

Thus, as shown in FIG. 3, in the test circuit of the present invention comprising the selector 2 and the comparison control circuit 3, the comparison control circuit 3 generates the control signal e and outputs the generated control signal e to the selector 2 when the output data Pout from the object circuit 1 are different from the expected data, and the selector 2 receives the control data e and then outputs the output data Pout based on the control signal e.

Figure 4:
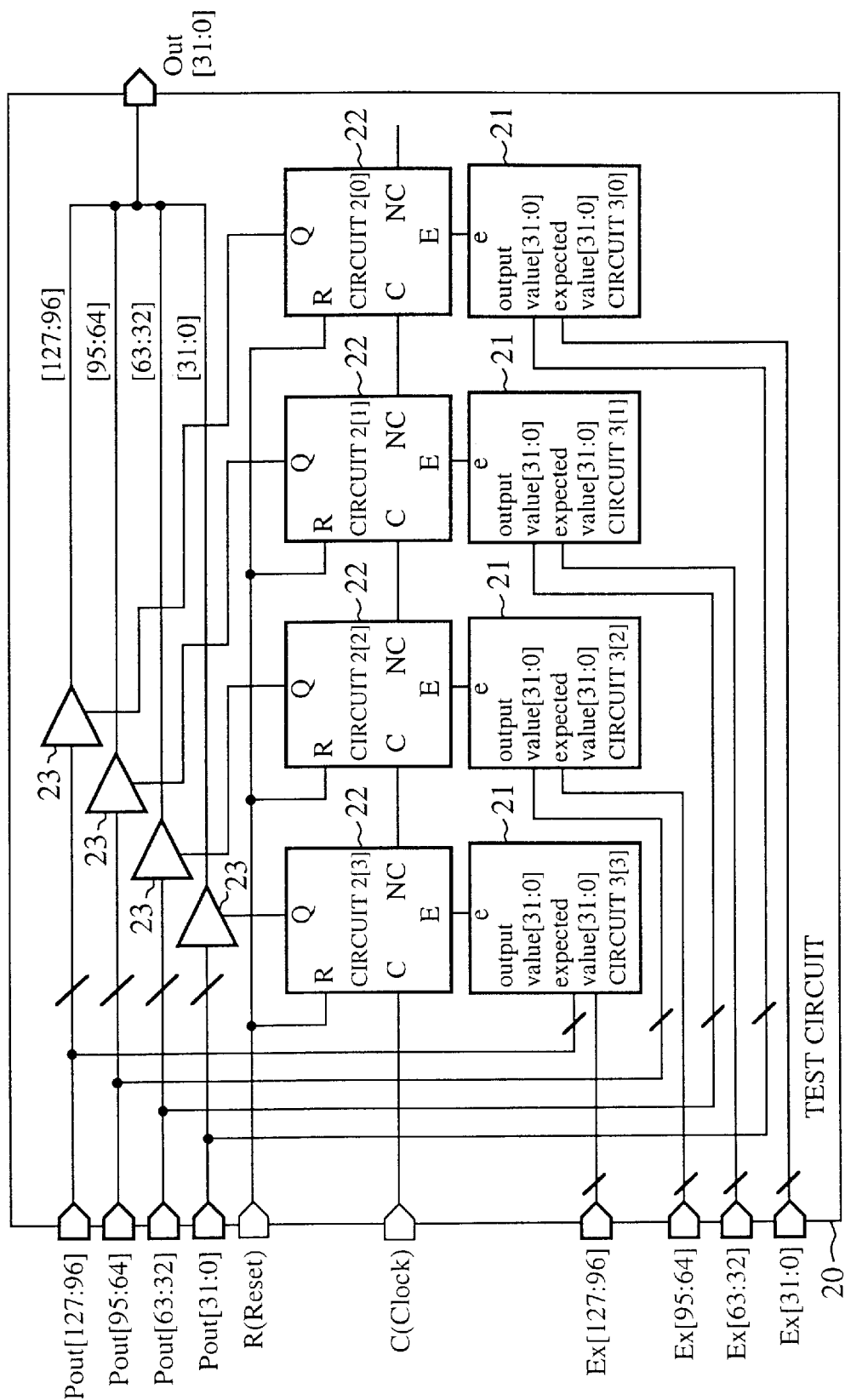
FIG. 4 is a circuit diagram showing a configuration of a test circuit according to the first embodiment of the present invention.

FIG. 4 is a circuit diagram showing a configuration of a test circuit 20 according to the first embodiment of the present invention. In FIG. 4, each reference number 21 designates a comparison circuit, each reference number 22 denotes a counter, and each reference number 23 indicates a tri state buffer. In the test circuit 20 shown in FIG. 4, the output data Pout as the test results from the object circuit 1 (not shown in FIG. 4) are compared with the expected data Ex per 32 bits. Thus, the test circuit 20 of the first embodiment comprises the comparison circuit 21, the counter circuit 22, and the tri state buffer 23 per 32 bits in the output data Pout transferred from the object circuit 1 for test. Accordingly, the test circuit 20 shown in FIG. 4 comprises four counter circuits 21, four comparison circuits 22, and four tri state buffers 23.

The comparison circuits 21 compare the output data Pout [127:0] from the object circuit 1 (not shown in FIG. 4) with the expected data Ex[127:0] per 32 bits and outputs the comparison results as the control signal to the counter circuits 22. The counter circuits 22 control the operation of the tri state buffers 23.

Figure 5:
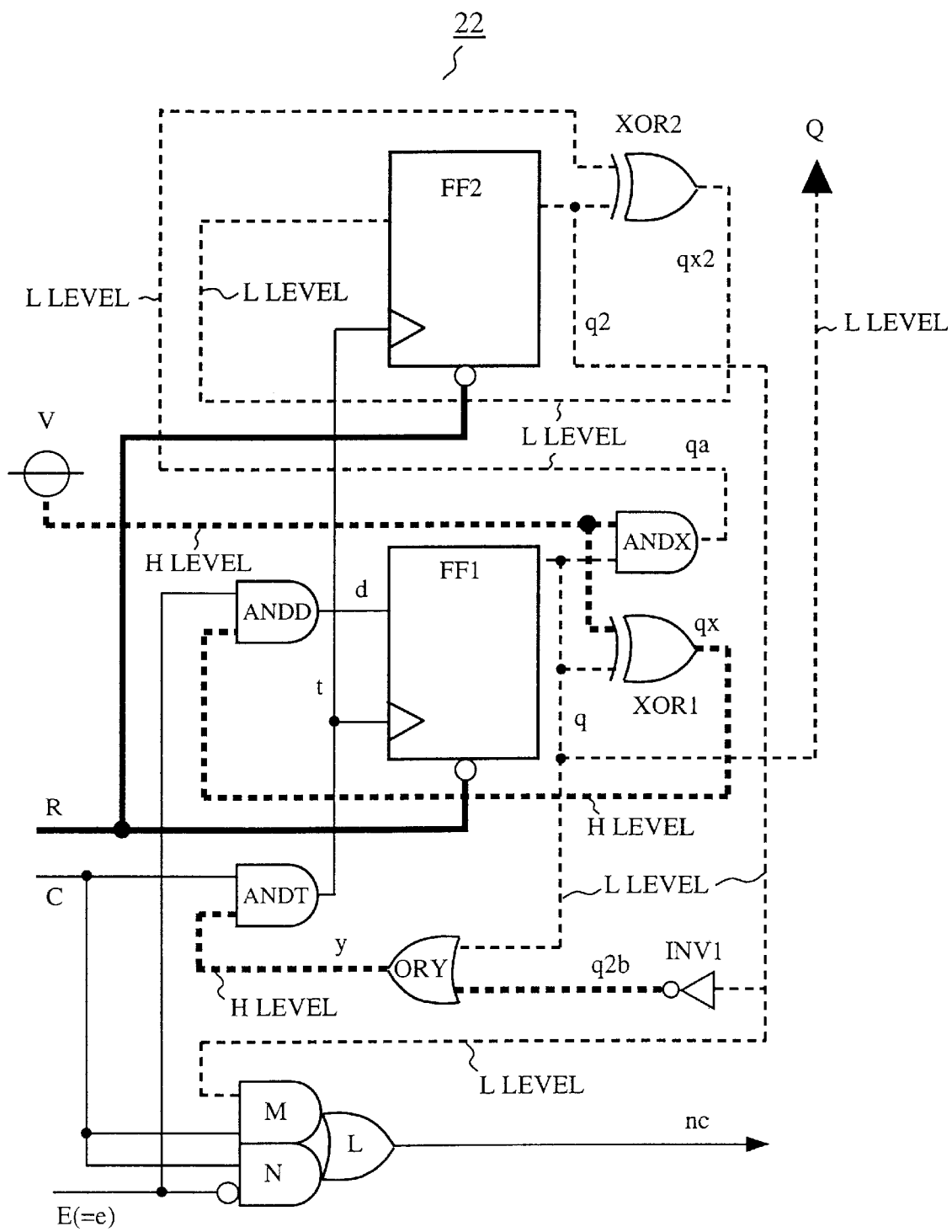
FIG. 5 is a circuit diagram showing a detailed configuration of a counter circuit incorporated in the test circuit shown in FIG. 4.

FIG. 5 is a circuit diagram showing a detailed configuration of each counter circuit 22 incorporated in the test circuit 20 shown in FIG. 4. The counter circuit 22 is an incrementer that outputs a signal of Q=1 to the tri state buffer 23 in synchronization with the clock signal C when the control signal E that indicates the comparison result outputted from the comparison circuit 21 is 1 (E=1).

The counter circuit 22 shown in FIG. 5 outputs the signal Q of 1 (Q=1) in synchronization with the change of the level of the following clock signal C. The clock signal C in the counter circuit 22 in the current stage is transferred through the terminal for the signal nc in its counter circuit 22 to the counter circuit 22 in the following stage, and further propagated to the counter circuit 22 in the final stage.

In addition, when the level of the control signal E that indicates the comparison result outputted from the comparison circuit 21 is zero (E=0), the counter circuit 21 outputs the signal Q=0 to the corresponding tri state buffer 23 in synchronization with the clock signal C. After this process, the clock signal C in the counter circuit 22 in the current stage is transferred through the terminal for the signal nc in its counter circuit 22 to the counter circuit 22 in the following stage, and further propagated to the counter circuit 22 in the final stage.

Figure 6:
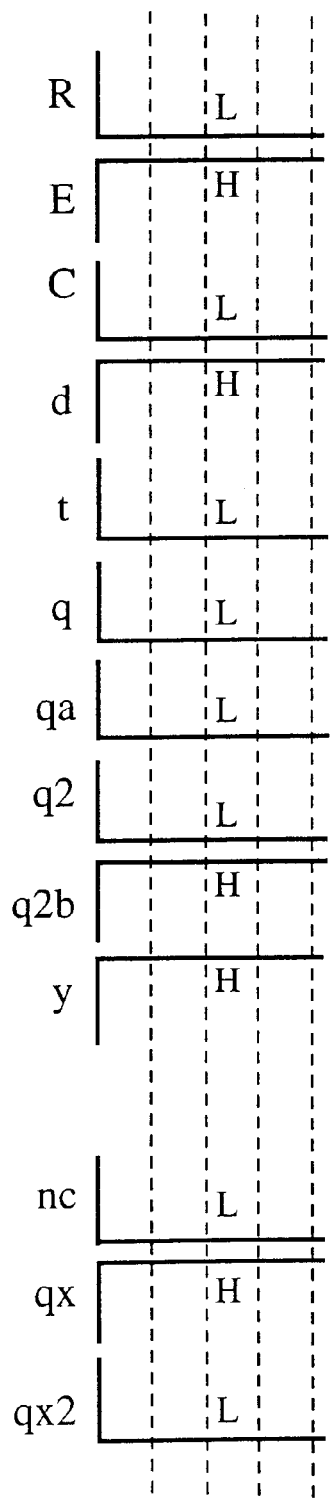
FIG. 6 is a diagram showing levels of various signals in the counter circuit shown in FIG. 5.

FIG. 6 is a diagram showing the levels of various signals such as the signal nc in a reset state of the operation of the counter circuit 22 shown in FIG. 5.

First, the level of the signal R is set to zero (R=0) in order to reset the counter circuit 22. Thereby, both the outputs q and q2 from flip flops FF1 and FF2 become zero (q=0 and q2=0). Accordingly, the level of a signal qx is zero (qx=0), a signal qa is zero (qa=0), a signal y is 1 (y=1), and a signal qx2 is zero (qx2=0). The signal q2b has an inverted value of the signal q. In the case shown in FIGS. 5 and 6, since the level of the signal q2 is zero, the level of the signal q2b becomes 1.

Since the level of one input y in the two input signals for a two-input AND gate is 1, the change of the level of the clock signal C is propagated to the clock input terminal of each of the flip flops FF1 and FF2. When the clock signal C is propagated during the state of the signal E=0, a gate L transfers the output of the gate N to the node nc.

On the other hand, because the value to be set into the flip flop FF1 is always 1 as long as the level of the signal E is zero (E=0), the output q of the flip flop FF1 is always zero (q=0).

Figure 7:
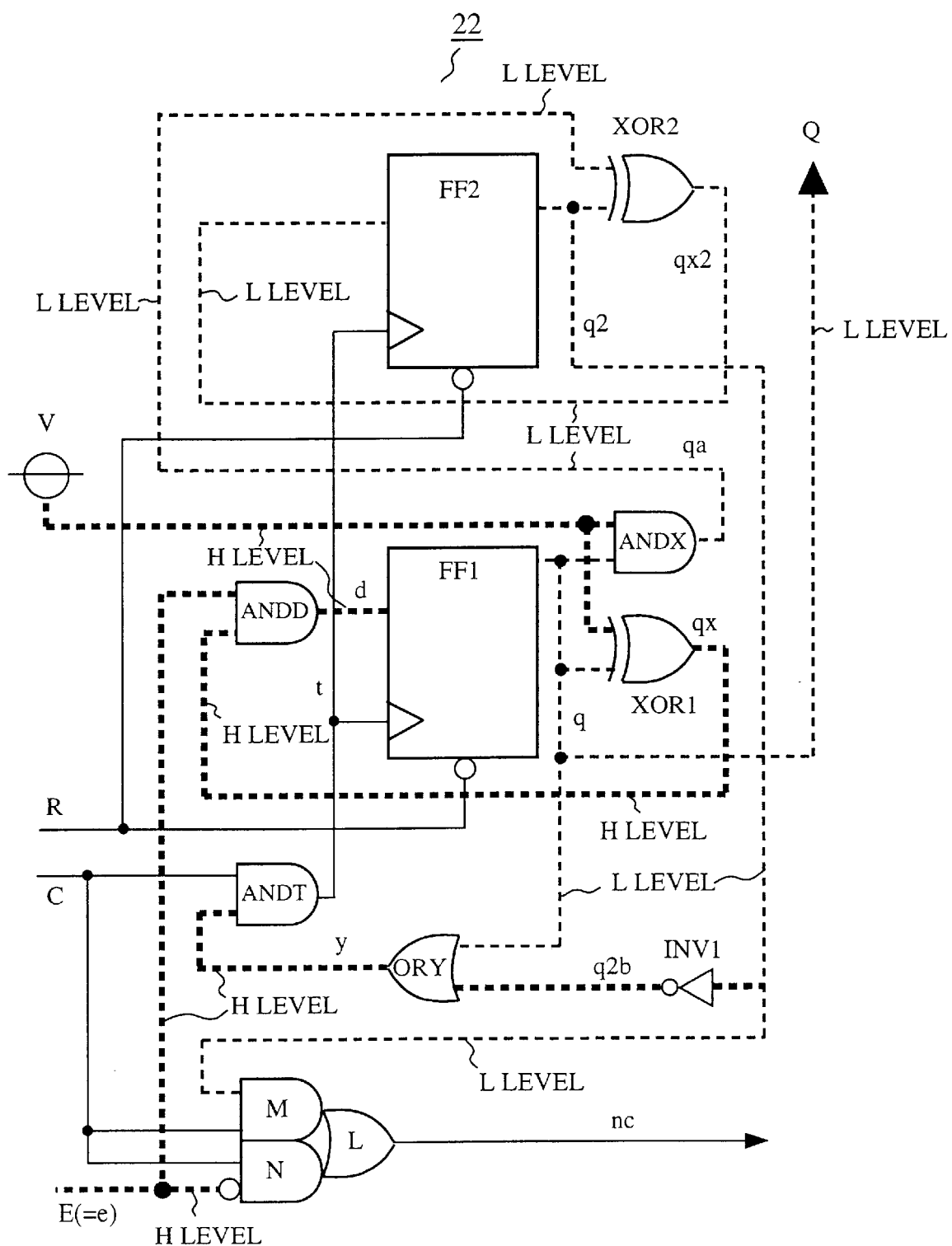
FIG. 7 is a circuit diagram showing a state before a first rising edge of a clock signal C is inputted when an enable signal E is a H level (E=1) in the counter circuit incorporated in the test circuit shown in FIG. 4.

FIG. 7 is a circuit diagram showing a state before a first rising edge (orapositive edge) of the clock signal C is inputted when an enable signal E is a H level (E=1) in the counter circuit 22 incorporated in the test circuit 20 shown in FIG. 4. FIG. 10 is a diagram showing a level of each signal in the counter circuit 22 shown in FIGS. 7 to 9.

The reference character [α] shown in FIG. 10 indicates the rising edge (or the positive edge) of the clock signal C in the counter circuit 22 shown in FIG. 7.

First, when the rising edge of the clock signal C indicated by the reference character [α] shown in FIG. 10 is propagated during the high (H) level (E=1) of the signal E, the level of one input qx of the two-input AND gate ANDD is 1. Therefore the H level (E=1) of the signal E is propagated to the signal d.

The level of the signal d is set to the flip flop FF1 based on the level change of the clock signal t. The level (qx2=0) of the signal qx2 is also propagated and set to the flip flop FF2 in synchronization with the clock signal t.

Because the level of the other input of the two-input AND gate M is zero, the output from the two-input AND gate M becomes zero. In this case, the clock signal C can not be propagated through the gate N.

In addition, because the level of the enable signal E in the state shown in FIG. 7 is the H level and the level of the other input of the two-input AND gate N is zero, the clock signal C can not also be propagated through the gate N.

Figure 8:
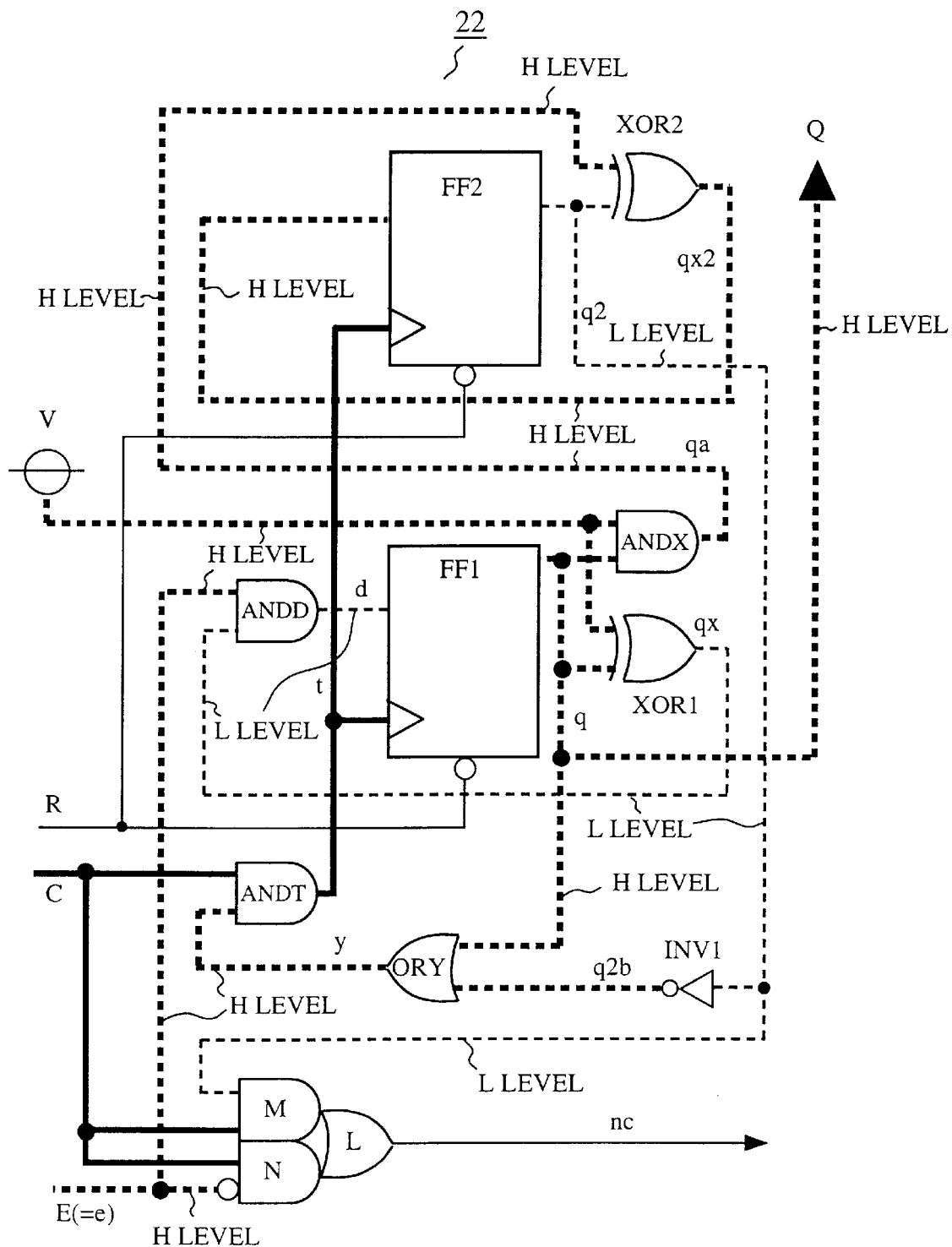
FIG. 8 is a circuit diagram showing a state before a second rising edge of the clock signal C is inputted after the first rising edge of the clock signal C has been inputted when the enable signal E is the H level (E=1) in the counter circuit incorporated in the test circuit shown in FIG. 4.

FIG. 8 is a circuit diagram showing a state before a second rising edge [β] of the clock signal C is inputted after the first rising edge [α] of the clock signal C has been inputted when the enable signal E is the H level (E=1) in the counter circuit 22 incorporated in the test circuit 20 shown in FIG. 4. In this case, the reference characters [α] and [β] shown in FIG. 10 indicate these first and second rising edges of the clock signal C.

First, the level of the signal q becomes 1 (q=1), the level of the signal qa becomes 1 (qa=1), and the level of the signal qx becomes zero (qx=0) after the first rising edge [α] of the clock signal C shown in FIG. 10 has been inputted to the counter circuit 22. In this case, the levels of both the signals q2 and qx2 also become zero (q2=0) and 1 (qx2=1), respectively. The level of the signal d becomes zero (d=0) simultaneously.

As a result, the output y of the OR gate ORY becomes 1 (H level).

Figure 9:
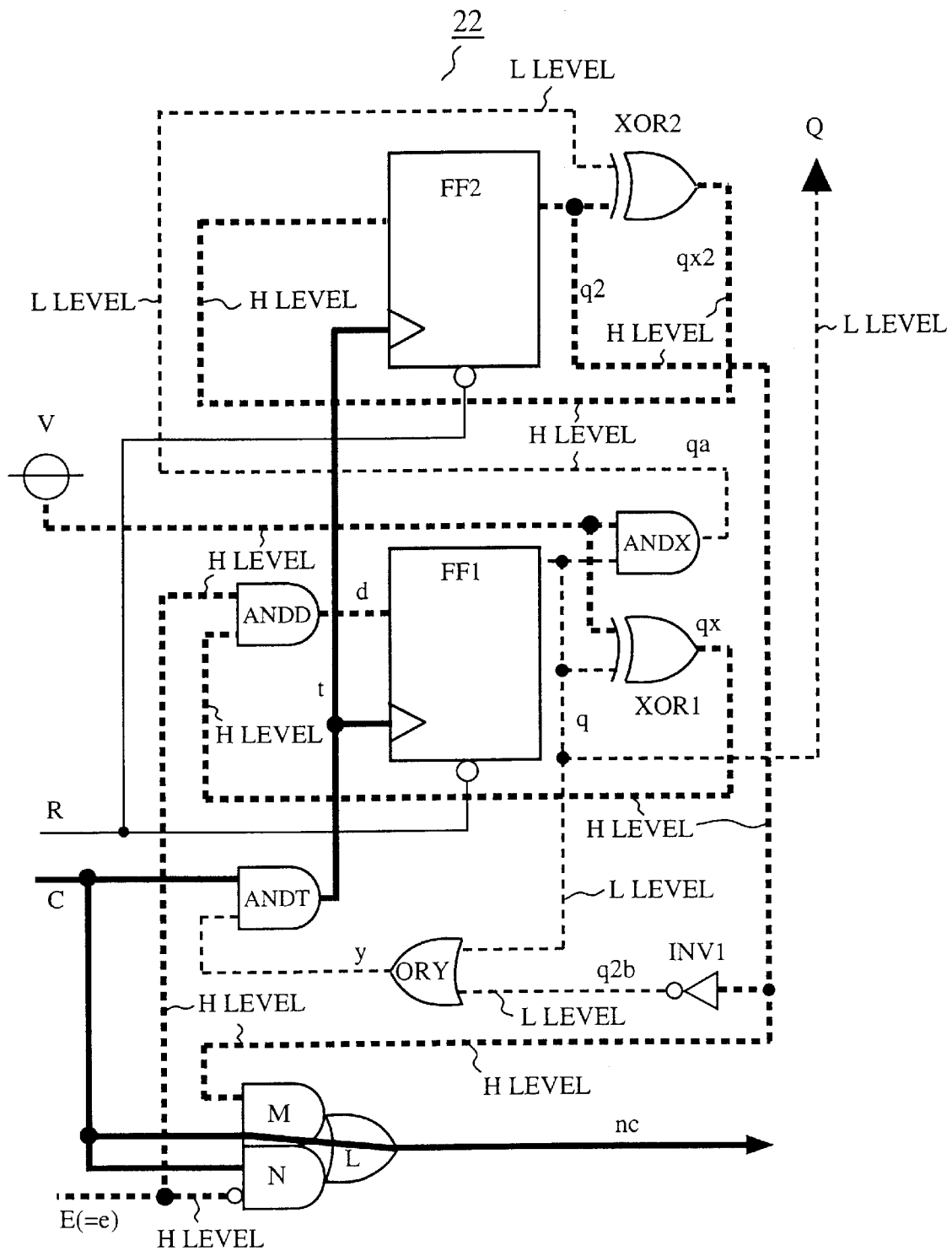
FIG. 9 is a circuit diagram showing a state after the second rising edge of the clock signal C has been inputted when the enable signal E is the H level (E=1) in the counter circuit incorporated in the test circuit shown in FIG. 4.
Figure 10:
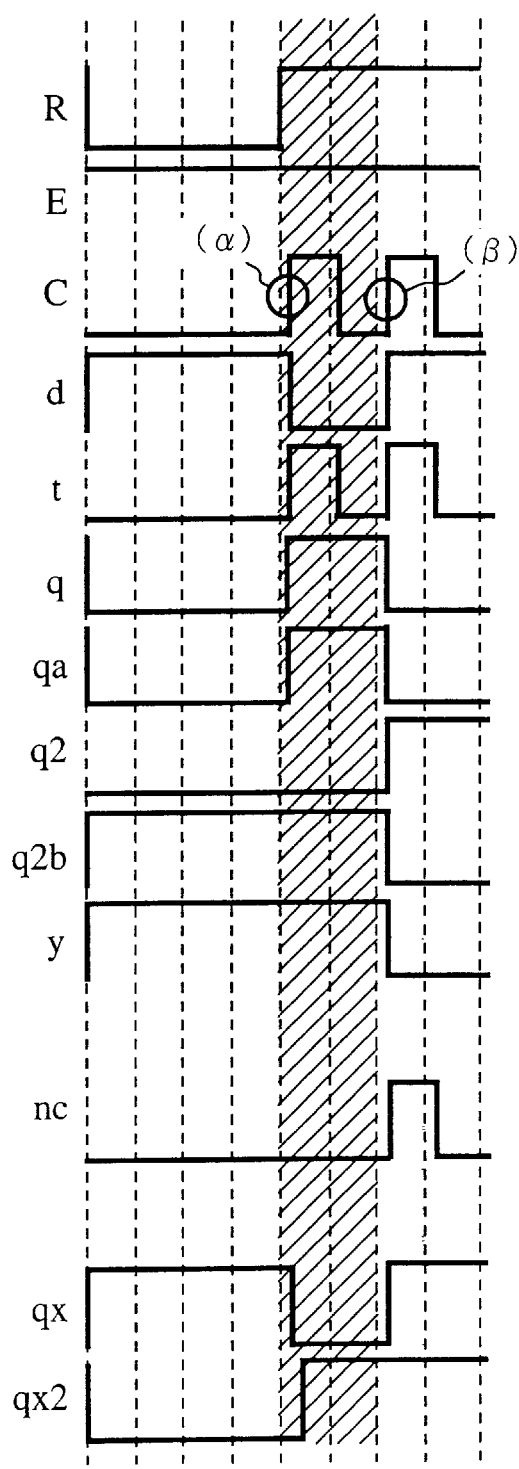
FIG. 10 is a diagram showing levels of various signals in the counter circuit shown in FIGS. 7 to 9.

FIG. 9 is a circuit diagram showing a state after the second rising edge of the clock signal C has been inputted when the enable signal E is the H level (E=1) in the counter circuit 22 incorporated in the test circuit 20 shown in FIG. 4. The reference character [β] shown in FIG. 10 indicates this rising edge of the clock signal C.

As shown in FIG. 10, when the second rising edge [β] of the clock signal C is inputted to the counter circuit 22, the clock signal C is propagated through the AND gate ANDT because the level of the signal y is 1 (y=1). Therefore the flip flops FF1 and FF2 keep the level (d=0) of the signal d and the level (qx2=1) of the signal qx2, respectively.

Next, because the level of the signal q2 becomes 1 (q2=1), the clock signal C is propagated through the AND gate M and then outputted to the counter circuit 22 in the following stage. In addition, the values kept in the flip flops FF1 and FF2 become the level value on each node based on the manner shown in FIGS. 7 and 8.

As a result, because the level of the signal y becomes zero (y=0), the level change of the clock signal C after the rising edge [β] of the clock signal C shown in FIG. 10 can not be propagated to both the flip flops FF1 and FF2. That is to say, the operation of each of the flip flops FF1 and FF2 halts by receiving the second rising edge [β] of the clock signal C. Furthermore, because the level (d=1) of the signal d is maintained, the clock signal C is propagated through the counter circuit 22 in which the operation of both the flip flops FF1 and FF2 halt and transferred to the counter circuit 22 in the following stage.

Figure 11:
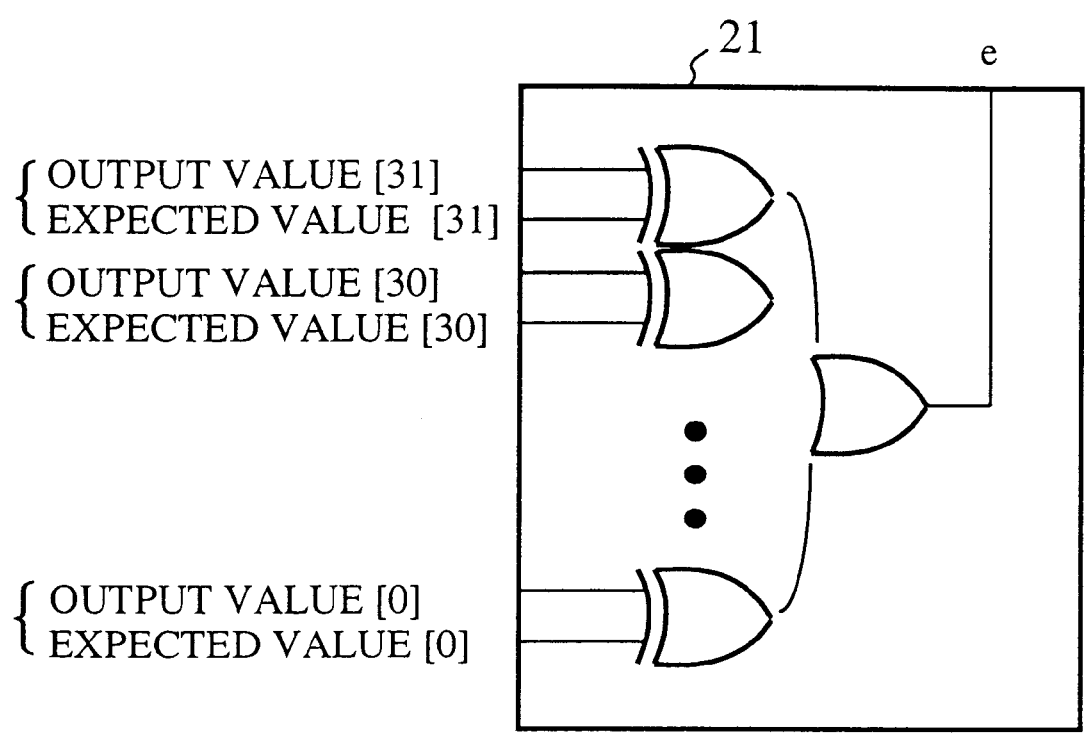
FIG. 11 is a circuit diagram showing a configuration of a comparison circuit incorporated in the test circuit shown in FIG. 4.

FIG. 11 is a circuit diagram showing a configuration of the comparison circuit 21 incorporated in the test circuit 20 shown in FIG. 4. As shown in FIG. 11, the comparison circuit 21 compares the output Pout from the object circuit 1 for test with the expected values per bit and outputs the control signal e=0 when both data are equal, and outputs the control signal e=1 when both data are not equal. One comparison circuit 21 shown in FIG. 11 compares the 32 bits data. Accordingly, the number of the comparison circuits 21 in the test circuit shown in FIG. 4 is four when the size of the output data Pout is 128 bits.

When inputting a reset signal R through a reset terminal, the test circuit 20 shown in FIG. 4 is reset. The output signal Q[3:0] in the counter circuit 22 becomes 0000, each tri state buffer 23 is switched a disable state, and the output Out [31:0] of the test circuit 20 has a high impedance.

Next, when receiving the expected data Ex supplied from the outside such as the external tester (not shown), each of the four comparison circuits 21 compares the output data Pout from the test circuit 1 with the expected data Ex per 32 bits by the following manner:

| Pout | [127:96] | vs | Ex | [127:96]; |
| Pout | [95:64] | vs | Ex | [95:64]; |

|  |  |  |  |  |
|---|---|---|---|---|
| Pout | [63:32] | vs | Ex | [63:32]; and |
| Pout | [31:0] | vs | Ex | [31:0]. |

As a result, when both data Pout and Ex are equal, the comparison circuit 21 outputs the signal e=1, and the comparison circuit 21 outputs the signal e=0 when both data Pout and Ex are not equal.

Each counter circuit 22 inputs the signal e as a signal E transferred from the corresponding comparison circuit 21. For example, when the value of the signal E is 1 (E=1 and e=1), the counter circuit 22 sets its output q to 1 (q=1) in synchronization with the clock signal C transferred through the terminal of the test circuit 20 shown in FIG. 4.

Because the counter circuit 22 sets the output signal q to zero (q=0) when receiving the following clock signal c, the signal q becomes 1 (q=1) during one period, and then becomes zero (q=0). Further, the clock signal C is not propagated to the counter circuit 22 when the output signal q is 1 (q=1). However, the clock signal C by which the output signal q is set to zero (q=0) can be propagated to the counter circuit 22. For example, when the input signal E is zero (E=0), the counter circuit 22 generates and maintains the signal Q of zero (Q=0). In this situation, when receiving the clock signal C, the counter circuit 22 transfers the clock signal C to the counter circuit 22 in the following stage.

When the output signal Q from the counter circuit 22 is 1 (Q=1), the corresponding tri state buffer 23 is switched the enable state and thereby the output Pout having defect information from the object circuit 1 for test are transferred as the output signal Out to the outside of the test circuit 20.

On the other hand, when the output signal Q from the counter circuit 22 is zero (Q=0), the corresponding tri state buffer 23 is switched the disable state. In this case, the output signal Pout from the object circuit can not transferred to the outside of the test circuit 20.

In the test circuit 20 shown in FIG. 4, although the clock signal C is supplied to the four counter circuits 22, the plural counter circuits 22 can not output the signal Q of 1 (Q=1) and the plural tri state buffers 23 are switched the enable state (or ON state), simultaneously, Accordingly, it can be avoided to conflict the output signals Pout from the plural tri state buffers 23. Furthermore, even if the plural counter circuit 22 output the signal Q of 1 (Q=1), simultaneously, (that is to say, even if the output from the object circuit are equal to the expected data Ex), the test time can be reduced with increasing of a case that both data Pout and Ex are equal, because it is so constructed that the tri state buffer 23 corresponding to the output signal Q of zero (Q=0) can not output any data.

Next, an actual example will be explained.

It is assumed that the test results from the object circuit 1 and the expected data Ex have following values.

Test results h'00 00 00 00; and

Expected data Ex h'00 01 00 01, where the left side is an upper bit.

In this case, when the test circuit 20 shown in FIG. 4 inputs both the test results and the expected data Ex, the output signal e obtained by each comparison circuit 21 has the following values:

|  |  |  |  |  |
|---|---|---|---|---|
| Pout | [127:96] | vs | Ex | [127:96] | e = 0; |
| Pout | [95:64] | vs | Ex | [95:64] | e = 1; |
| Pout | [63:32] | vs | Ex | [63:32] | e = 0; and |
| Pout | [31:0] | vs | Ex | [31:0] | e = 1. |

Accordingly, the comparison results by the four comparison circuits 21 becomes e[3:0]=b'0101.

Figure 12:
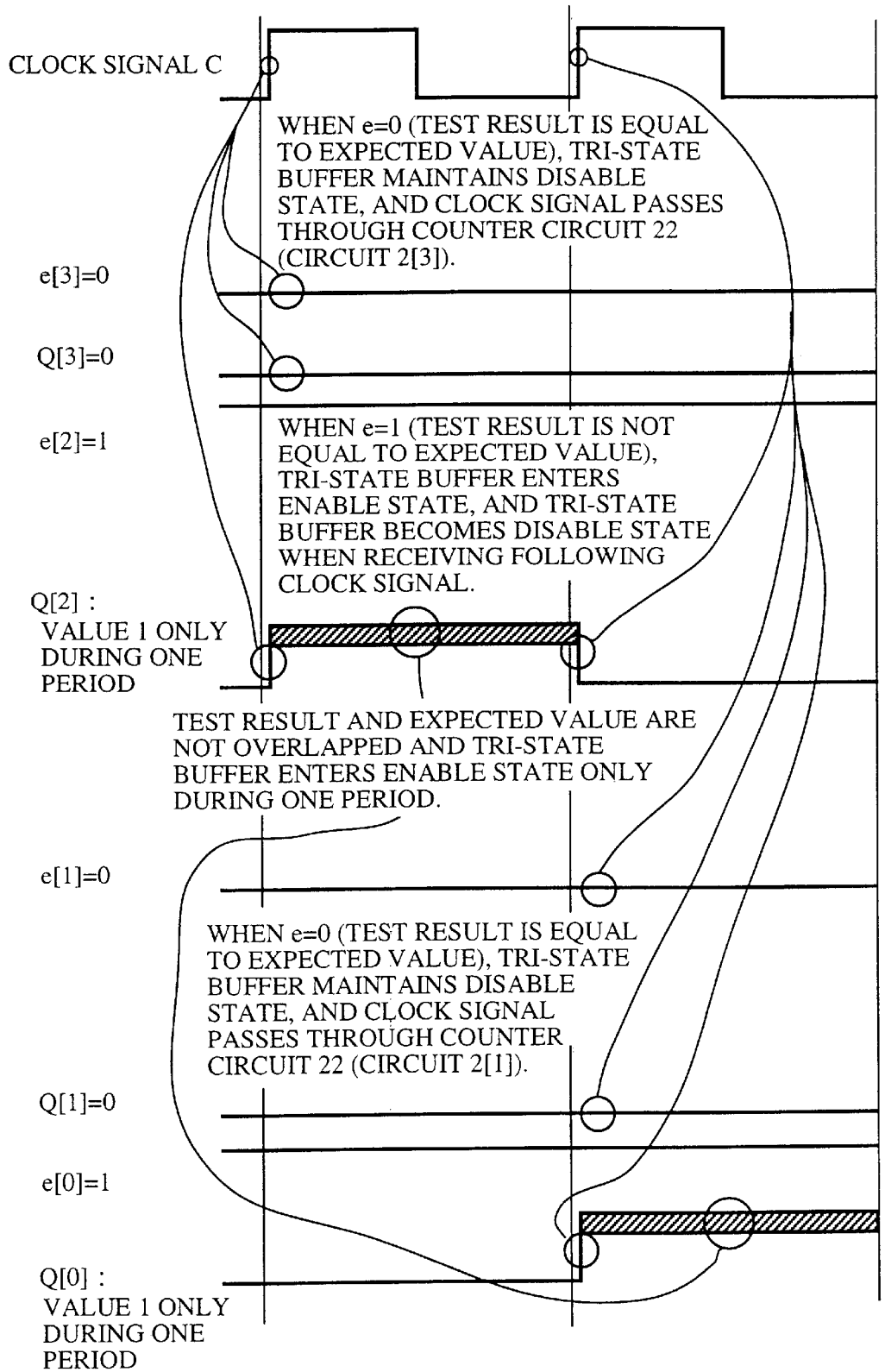
FIG. 12 is a diagram showing comparison results when output data from an object circuit for test is compared with expected data.
Figure 13:
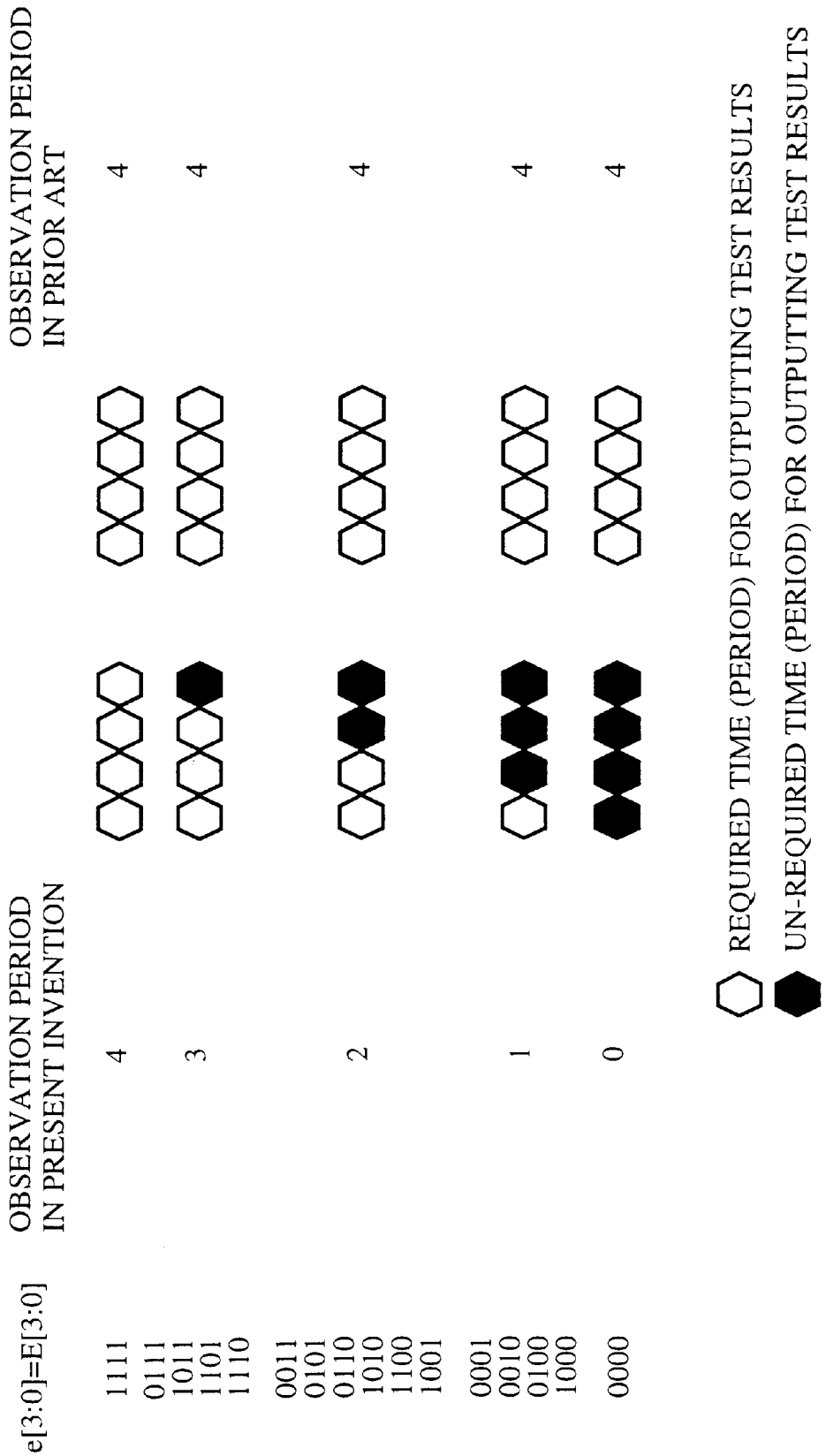
FIG. 13 is a diagram showing a comparison of the test circuit according to the first embodiment with the conventional test circuit.

FIG. 12 is a diagram showing the propagation of the clock signal C and the comparison results when the output data Pout from the object circuit 1 for test is compared with the expected data Ex. FIG. 13 is a diagram showing a comparison result between the test circuit 20 according to the first embodiment and the conventional test circuit.

As shown in FIG. 13, the comparison result between the observation period of the test circuit of the present invention (see the left side) and the observation period (see the right side) of the test circuit of the prior art indicates that more agreement between the output data from the object circuit and the expected data achieves the more reducing of the test time.

It is also possible to change the configuration of the test circuit corresponding to a bit width such as a data width of the semiconductor integrated circuit to be applied to the test circuit of the present invention. For example, when the test circuit has the 128 terminals and the semiconductor chip has the eight test output terminals, the number of the comparison circuits 21 and the number of the counter circuits 22 becomes 16, respectively.

In general, when the number of the terminals for outputs from the object circuit 1 is m (m is a natural number) and the number of usable terminals (to be used for observation of the test results) of the semiconductor chip is n (n is a natural number), the test circuit can be formed by using m/n or (m/n)+1 counter circuits 21 and the comparison circuits 22.

In the test circuit of the first embodiment, the flip flops FF1 and FF2 operable in the positive edge of the clock signal C. However, the present invention is not limited by this configuration, for example, it is possible to use flip flops operable in a negative edge of the clock signal C. In this case, the present invention also has the same effect. Furthermore, the tri state buffers 23 operating under a high enable state are used in the test circuit of the first invention. But, the present invention is not limited by this configuration, for example, it is possible to use tri state buffers operating under a low enable state in the test circuit, or to use a combination of both the tri state buffers that operate under the high and: low enable states. In this case, the same effect can also be obtained.

Moreover, although the counter circuits 22 in the test circuit of the first embodiment are used, one or more dedicated circuits having the same function of the counter circuits 22 can be incorporated in the test circuit instead of the counter circuits 22.

As described above, the test circuit according to the first embodiment has the configuration in which the comparison circuits 21 each comparing the output Pout from the object circuit 1 with the expected data Ex per predetermined bits, the counter circuits 22, and the tri state buffers 23 corresponding to the comparison circuits 21 are incorporated, and the output data Pout including the defect information to specify the fault section included in the object circuit 1 are transferred to the outside of the test circuit 20 in synchronization with the clock signal C only when the output data Pout are equal to the expected data Ex. Thereby, it is possible to reduce the test time when the output data Pout (or test results) transferred from the object circuit 1 are more in agreement with the expected data Ex.

Second Embodiment

Figure 14:
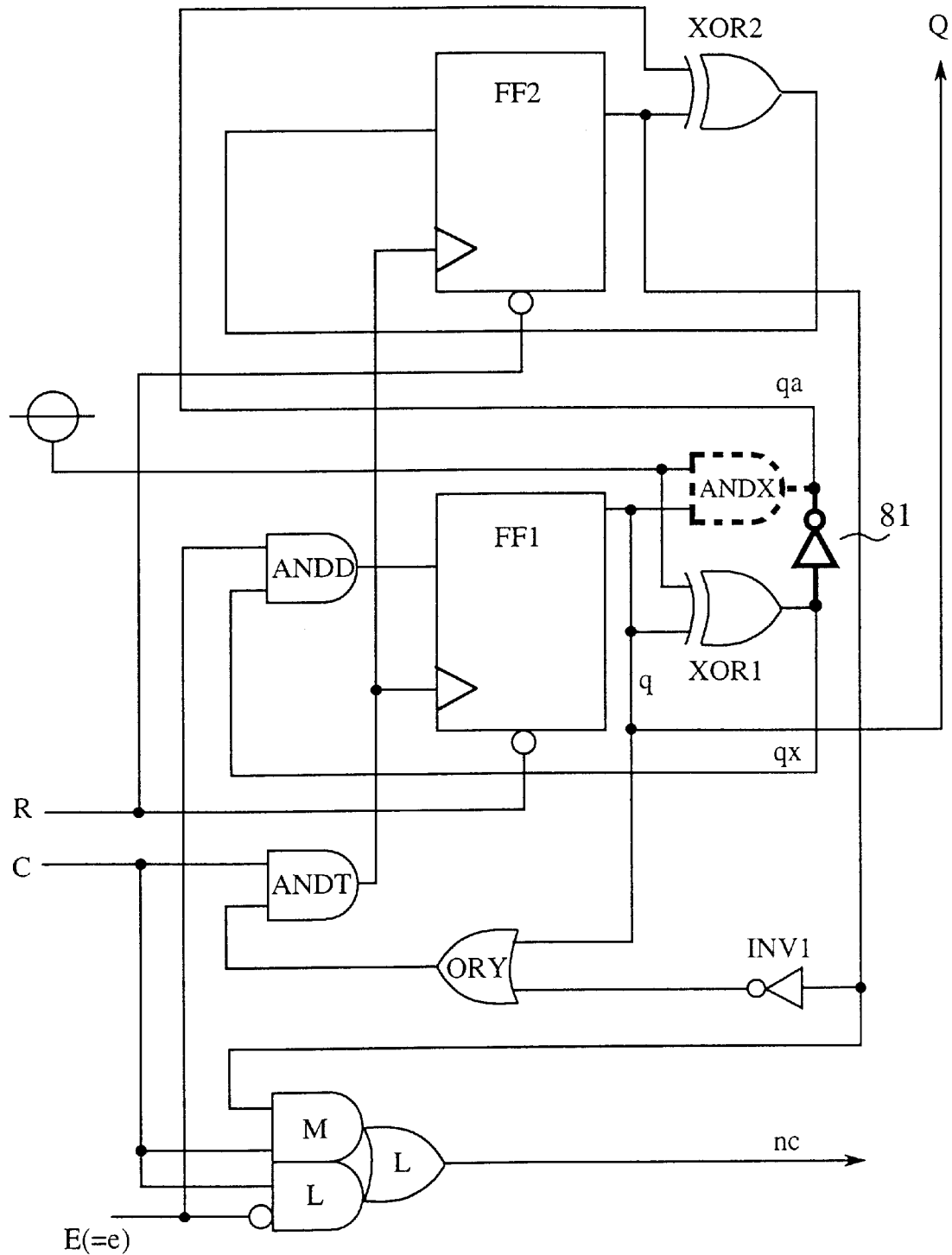
FIG. 14 is a circuit diagram showing a detailed configuration of a counter circuit incorporated in a test circuit according to the second embodiment of the present invention.

FIG. 14 is a circuit diagram showing a detailed configuration of the counter circuit incorporated in the test circuit according to the second embodiment of the present invention. In FIG. 14, the AND circuit ANDX designated by the dotted line has been eliminated from the configuration of the counter circuit 22 shown in FIG. 5. The reference number 81 designates an inverter. Other components in the counter circuit according to the second embodiment are equal to those of the counter circuit 22 according to the first embodiment, therefore the same reference characters and numbers are used for the same components and the explanation for the same components. therefore is omitted here.

Next, a description will be given of the operation of the test circuit according to the second embodiment.

In the counter circuit incorporated in the test circuit shown in FIG. 14, since the level of the signal qa is the inverted level of the signal qx (qa=/qx), the AND circuit ANDX in the counter circuit 22 shown in FIG. 5 is eliminated, and the inverter 81 is incorporated instead of the eliminated AND circuit ANDX. In this case, the output of the inverter 81 that inputs the output signal of the circuit XOR1 is used as the signal qa.

As described above, according to the second embodiment, because the inverter 81 is incorporated in the counter circuit shown in FIG. 14 instead of the AND circuit ANDX that is eliminated from the configuration of the counter circuit shown in FIG. 5, the area of the test circuit can be reduced when compared with the test circuit of the first embodiment shown in FIGS. 4 and 5.

Third Embodiment

Figure 15:
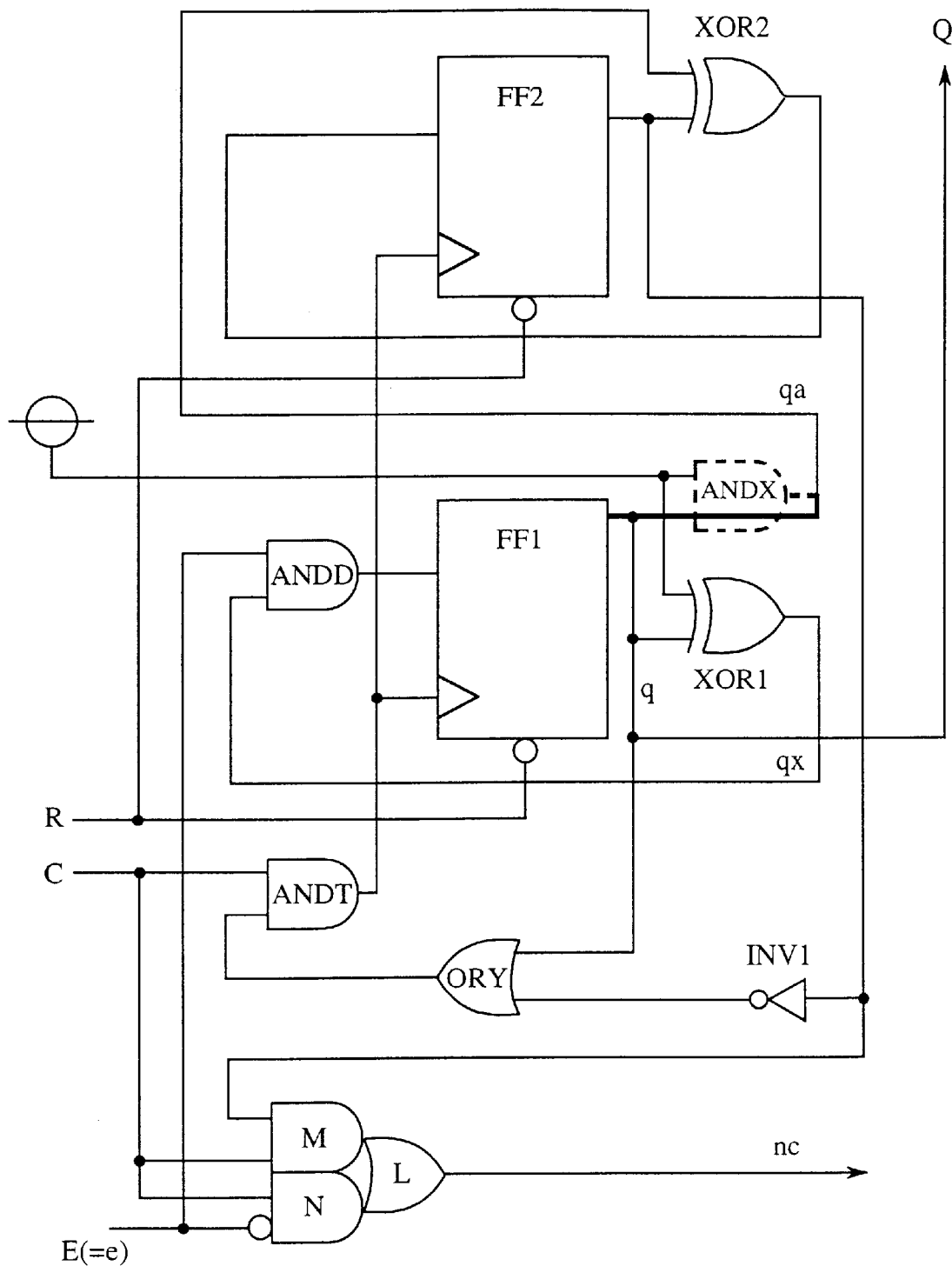
FIG. 15 is a circuit diagram showing a detailed configuration of a counter circuit incorporated in a test circuit according to the third embodiment of the present invention.

FIG. 15 is a circuit diagram showing a detailed configuration of the counter circuit incorporated in the test circuit according to the third embodiment of the present invention. In FIG. 15, the AND circuit ANDX designated by the dotted line has been eliminated from the configuration of the counter circuit 22 shown in FIG. 5. Other components in the counter circuit according to the third embodiment are equal to those of the counter circuit 22 according to the first embodiment, therefore the same reference characters and numbers are used for the same components and the explanation for the same components therefore is omitted here.

Next, a description will be given of the operation of the test circuit according to the third embodiment.

In the counter circuit incorporated in the test circuit shown in FIG. 15, since the level of the signal qa is equal to the level of the signal q (qa=q), the AND circuit ANDX incorporated in the counter circuit 22 shown in FIG. 5 has been eliminated, and the output signal of the flip flop FF1 is directly used as the signal qa.

As described above, according to the third embodiment, because the AND circuit ANDX is eliminated from the configuration of the counter circuit 22 shown in FIG. 5, the area of the test circuit can be reduced when compared with the test circuit according to the first embodiment shown in FIGS. 4 and 5.

Fourth Embodiment

Figure 16:
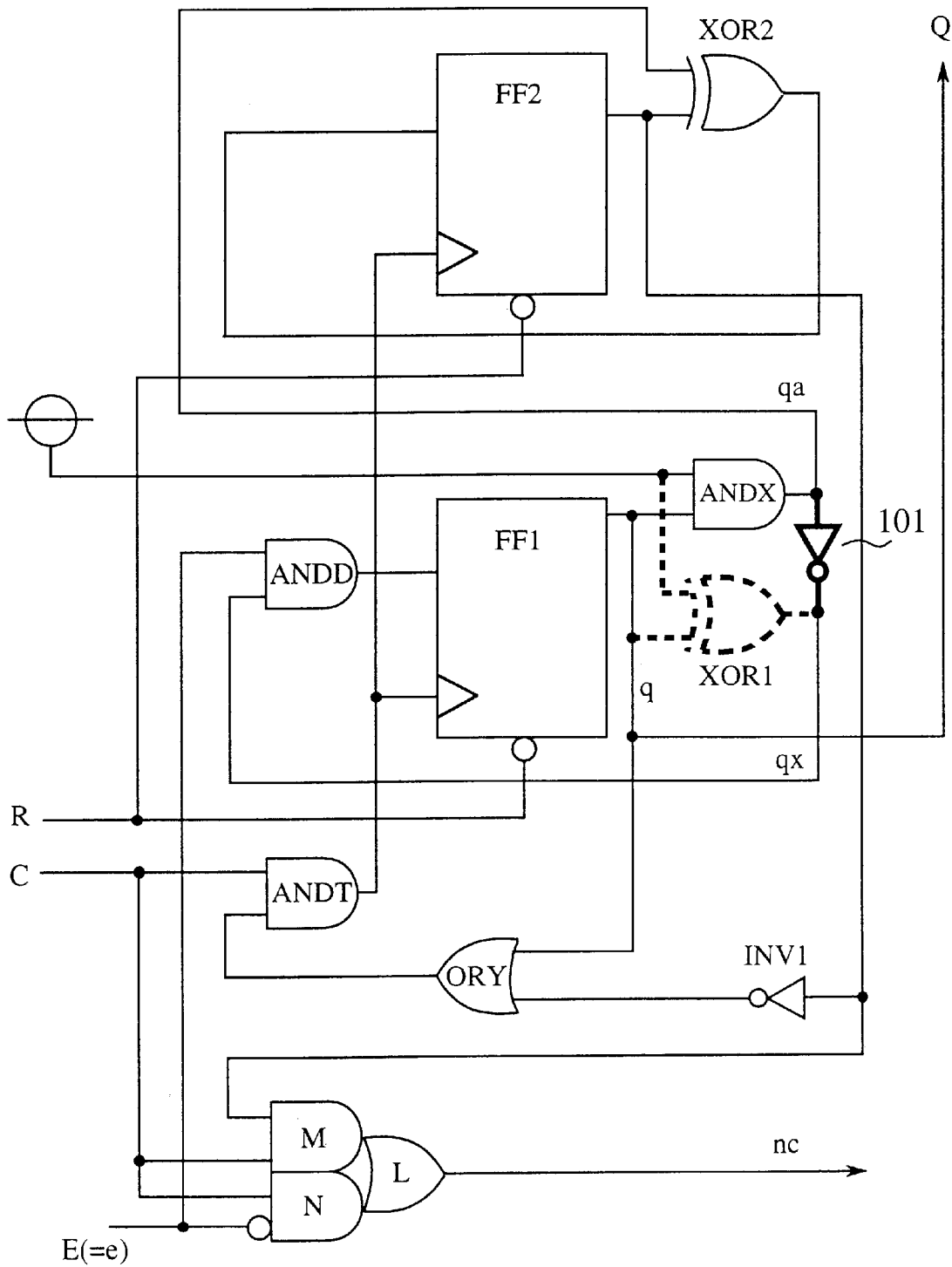
FIG. 16 is a circuit diagram showing a detailed In configuration of a counter circuit incorporated in a test circuit according to the fourth embodiment of the present invention.

FIG. 16 is a circuit diagram showing a detailed configuration of the counter circuit incorporated in the test circuit according to the fourth embodiment of the present invention. In FIG. 16, the XOR circuit XOR1 designated by the dotted line has been eliminated from the configuration of the counter circuit 22 shown in FIG. 5. The reference number 101 designates an inverter. Other components in the counter circuit according to the fourth embodiment are equal to those of the counter circuit 22 according to the first embodiment, therefore the same reference characters and numbers are used for the same components and the explanation for the same components therefore is omitted here.

Next, a description will be given of the operation of the test circuit according to the fourth embodiment.

Because the level of the signal qx is equal to the inverted level of the signal qa (qx=/qa), the XOR circuit XOR1 is eliminated from the configuration of the counter circuit 22 shown in FIG. 5, and the output signal of the AND circuit ANDX is provided to the inverter 101, and the output of the inverter 101 is used as the signal qx.

As described above, according to the fourth embodiment, because the XOR circuit XOR1 is eliminated from the configuration of the counter circuit 22 shown in FIG. 5; and the inverter 101 is incorporated instead of the eliminated XOR circuit XOR1, the area of the test circuit can be reduced when compared with the test circuit of the first embodiment shown in FIGS. 4 and 5.

Fifth Embodiment

Figure 17:
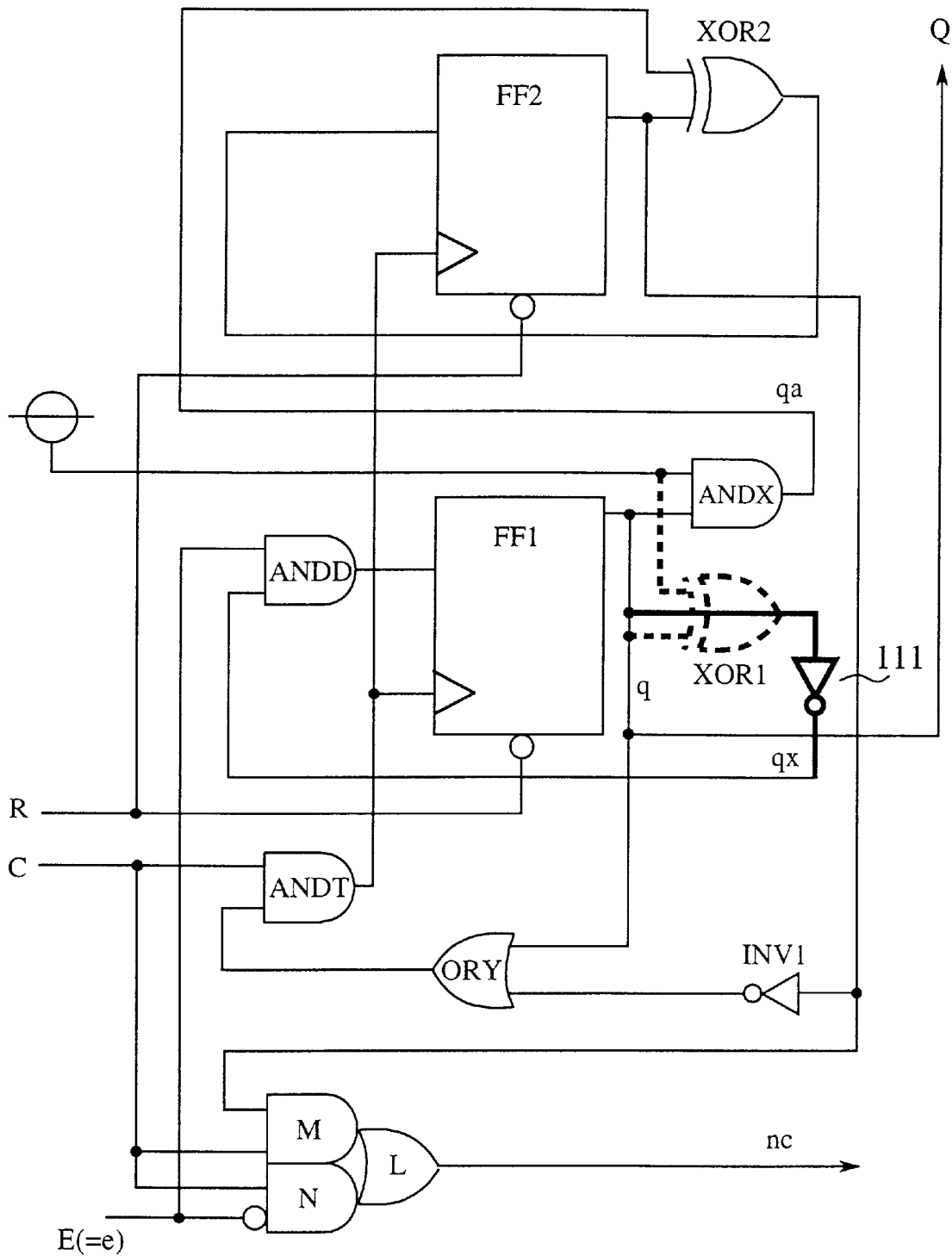
FIG. 17 is a circuit diagram showing a detailed configuration of a counter circuit incorporated in a test circuit according to the fifth embodiment of the present invention.

FIG. 17 is a circuit diagram showing a detailed configuration of the counter circuit incorporated in the test circuit according to the fifth embodiment of the present invention. In FIG. 17, the XOR circuit XOR1 designated by the dotted line has been eliminated from the configuration of the counter circuit 22 shown in FIG. 5. The reference number 111 designates an inverter. Other components in the counter circuit according to the fifth embodiment are equal to those of the counter circuit 22 according to the first embodiment, therefore the same reference characters and numbers are used for the same components and the explanation for the same components therefore is omitted here.

Next, a description will be given of the operation of the test circuit according to the fifth embodiment.

Because the level of the signal qx is equal to the inverted level of the signal q (qx=/q), the XOR circuit XOR1 is eliminated from the configuration of the counter circuit 22 shown in FIG. 5, and the output signal of the flip flop FF1 is provided to the inverter 111, and the output of the inverter 111 is used as the signal qx.

As described above, according to the fifth embodiment, because the XOR circuit XOR1 is eliminated from the configuration of the counter circuit 22 shown in FIG. 5 and the inverter 111 is incorporated instead of the eliminated XOR circuit XOR1, the area of the test circuit can be reduced when compared with the test circuit of the first embodiment shown in FIGS. 4 and 5.

Sixth Embodiment

Figure 18:
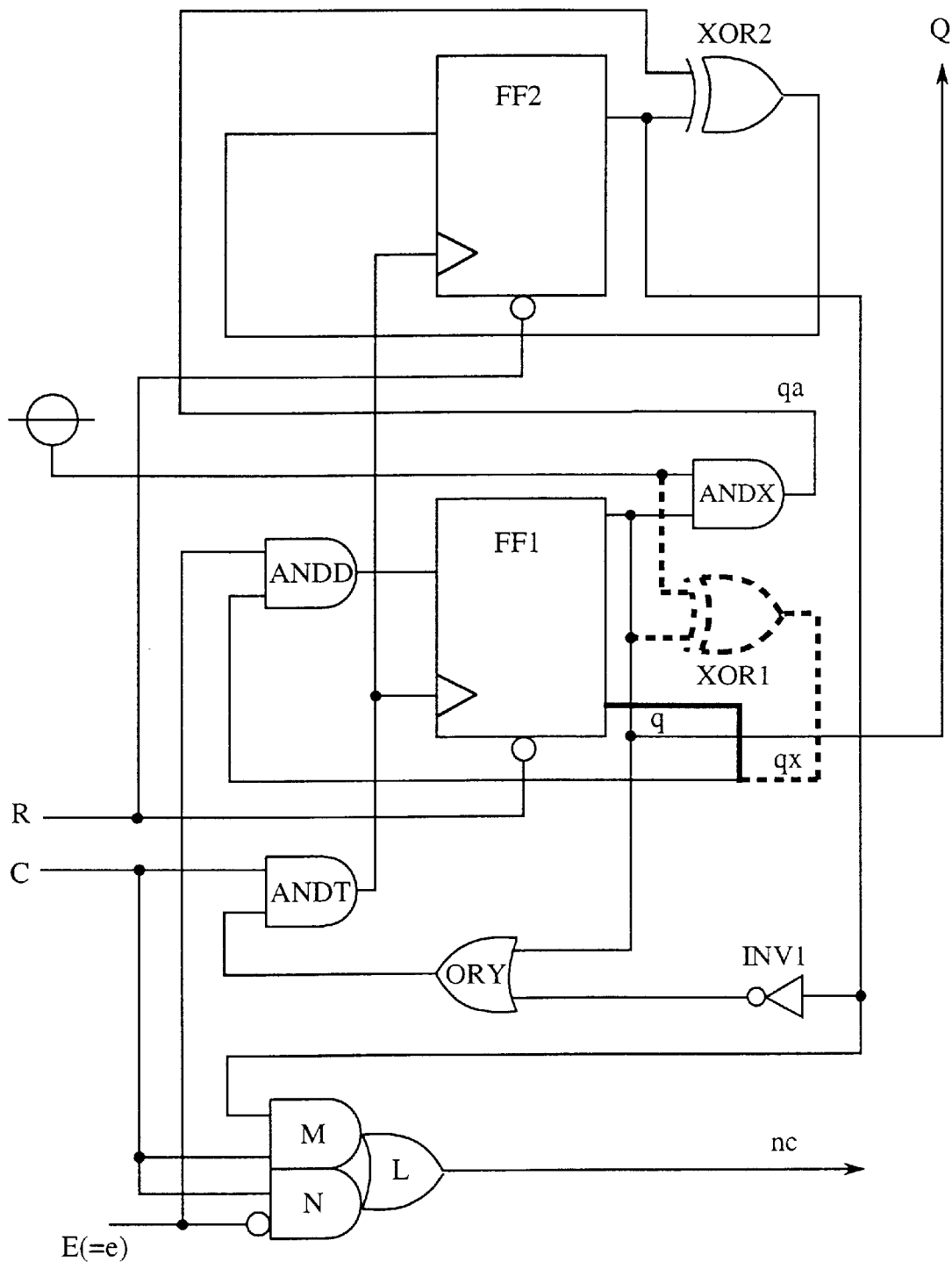
FIG. 18 is a circuit diagram showing a detailed configuration of a counter circuit incorporated in a test circuit according to the sixth embodiment of the present invention.

FIG. 18 is a circuit diagram showing a detailed configuration of the counter circuit incorporated in the test circuit according to the sixth embodiment of the present invention. In FIG. 18, the XOR circuit XOR1 designated by the dotted line has been eliminated from the configuration of the counter circuit 22 shown in FIG. 5. Other components in the counter circuit according to the sixth embodiment are equal to those of the counter circuit 22 according to the first embodiment, therefore the same reference characters and numbers are used for the same components and the explanation for the same components therefore is omitted here.

Next, a description will be given of the operation of the test circuit according to the sixth embodiment.

If the output signal of the flip flop FF1 is equal to the inverted level of the signal q, it is not required to incorporate any inverter that outputs the level of the signal qx in the configuration of the counter circuit 22 shown in FIG. 5. Accordingly, the XOR circuit XOR1 is eliminated from the configuration of the counter circuit 22 shown in FIG. 5 and the output signal of the flip flop FF1 is used as the signal qx.

As described above, according to the sixth embodiment, because the XOR circuit XOR1 is eliminated from the configuration of the counter circuit 22 shown in FIG. 5 and the output signal of the flip flop FF1 is used as the signal qx, the area of the test circuit can be reduced when compared with the test circuit of the first embodiment shown in FIGS. 4 and 5.

Seventh Embodiment

Figure 19:
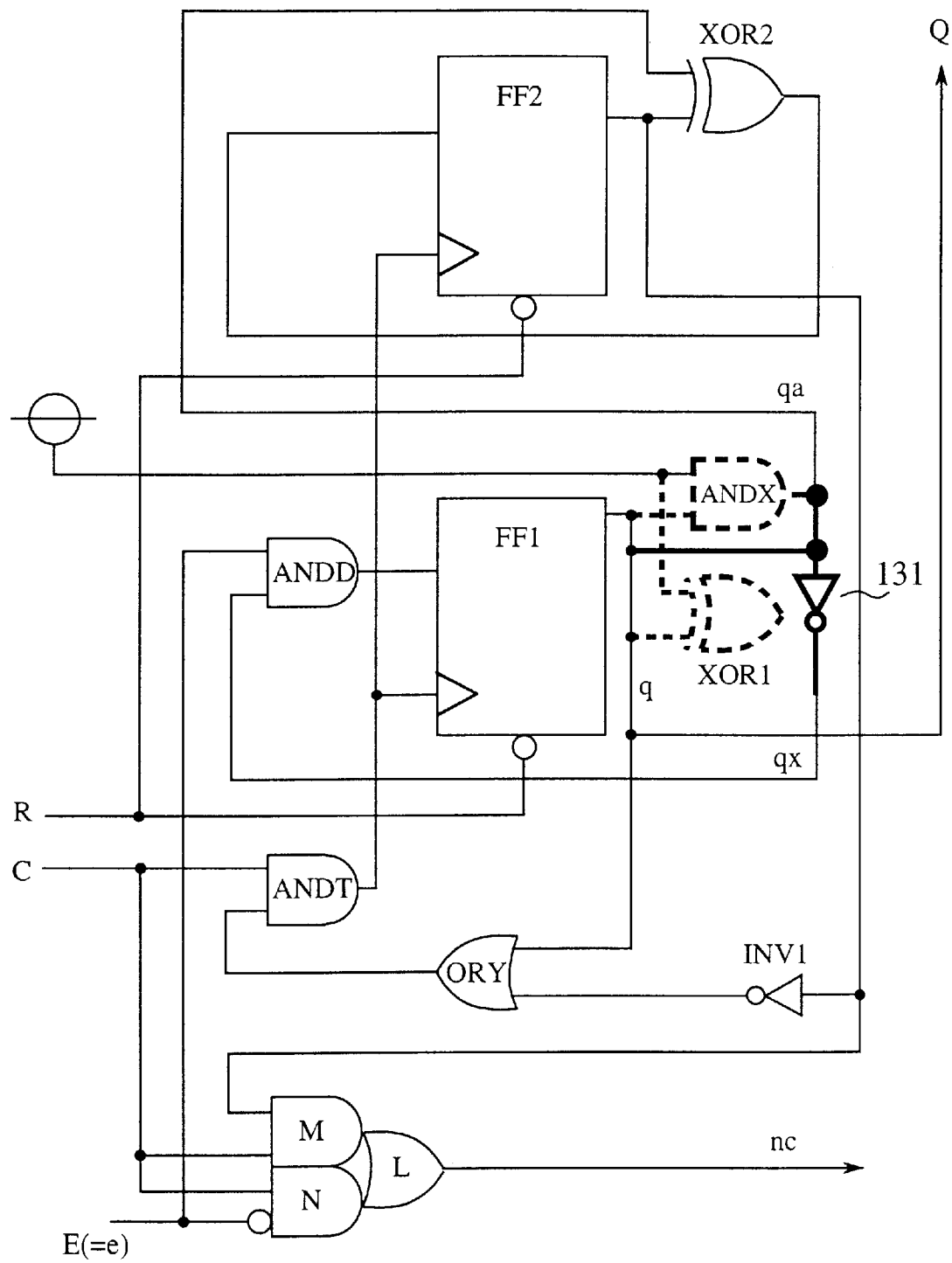
FIG. 19 is a circuit diagram showing a detailed configuration of a counter circuit incorporated in a test circuit according to the seventh embodiment of the present invention.

FIG. 19 is a circuit diagram showing a detailed configuration of the counter circuit incorporated in the test circuit according to the seventh embodiment of the present invention. In FIG. 19, the AND circuit ANDX and the XOR circuit XOR1 designated by the dotted line have been eliminated from the configuration of the counter circuit 22 shown in FIG. 5. The reference number 131 designates an inverter. Other components in the counter circuit according to the seventh embodiment are equal to those of the counter circuit 22 according to the first embodiment, therefore the same reference characters and numbers are used for the same components and the explanation for the same components therefore is omitted here.

Next, a description will be given of the operation of the test circuit according to the seventh embodiment.

Because the level of the signal q is equal to the level of the signal qa, and also equal to the inverted level of the signal qx (q=qa=/qx), the AND circuit ANDX and the XOR circuit XOR1 are eliminated from the configuration of the counter circuit 22 shown in FIG. 5, and the output signal of the flip flop FF1 is provided to the inverter 131, and the output of the inverter 131 is used as the signal qa.

As described above, according to the seventh embodiment, because both the AND circuit ANDX and the XOR circuit XOR1 are eliminated from the configuration of the counter circuit 22 shown in FIG. 5 and the inverter 131 is incorporated instead of the eliminated AND circuit ANDX and the eliminated XOR circuit XOR1, the area of the test circuit can be reduced when compared with the test circuit of the first embodiment shown in FIGS. 4 and 5.

Eighth Embodiment

Figure 20:
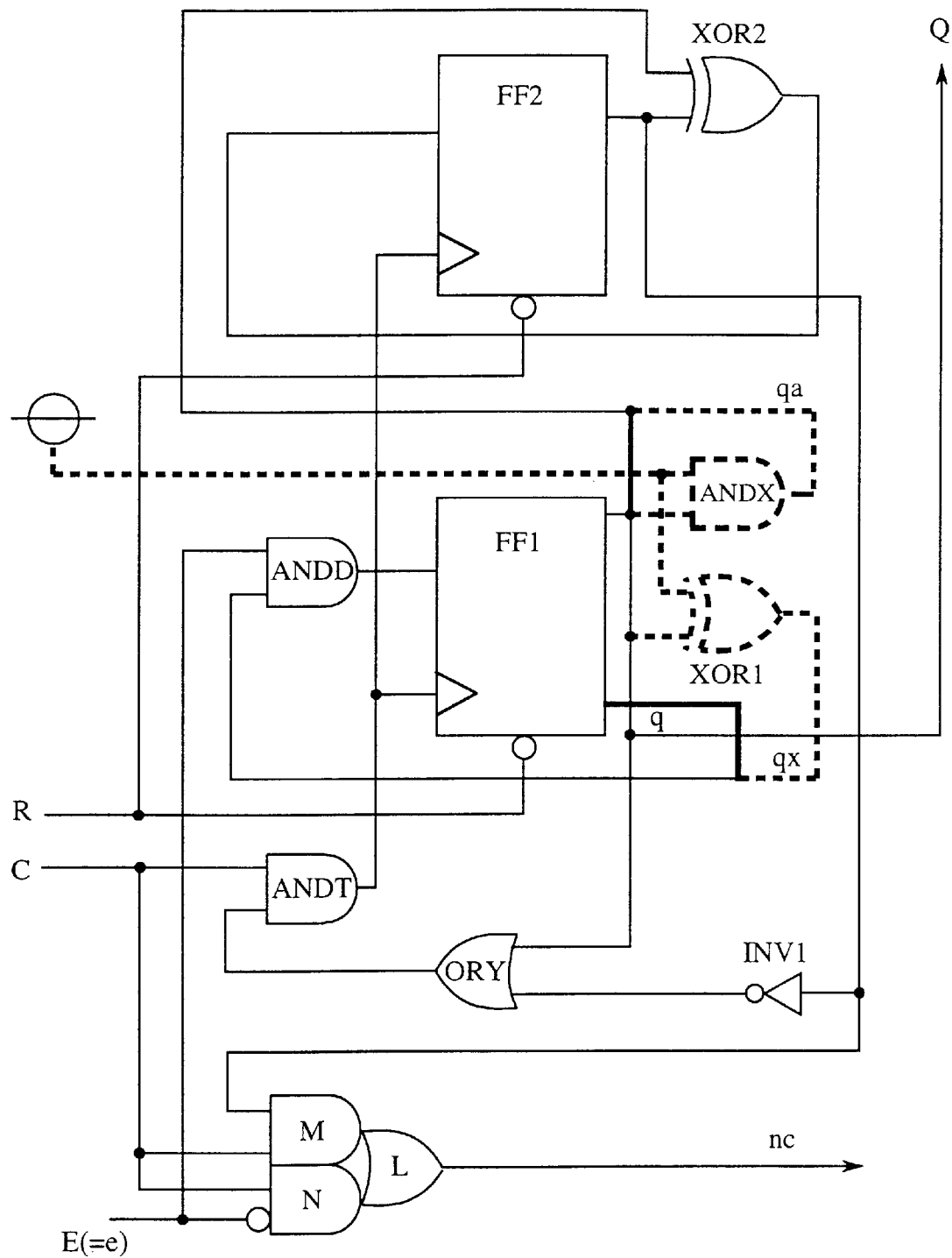
FIG. 20 is a circuit diagram showing a detailed configuration of a counter circuit incorporated in a test circuit according to the eighth embodiment of the present invention.

FIG. 20 is a circuit diagram showing a detailed configuration of the counter circuit incorporated in the test circuit according to the eighth embodiment of the present invention. In FIG. 20, the AND circuit ANDX and the XOR circuit XOR1 designated by the dotted line have been eliminated from the configuration of the counter circuit 22 shown in FIG. 5. Other components in the counter circuit according to the eighth embodiment are equal to those of the counter circuit 22 according to the first embodiment, therefore the same reference characters and numbers are used for the same components and the explanation for the same components therefore is omitted here.

Next, a description will be given of the operation of the test circuit according to the eighth embodiment.

If the inverted level/q of the signal q can be used as the output signal of the flip flop FF1, the signal qx can be generated without incorporating the inverter 131 shown in FIG. 19. Accordingly, the AND circuit ANDX and the XOR circuit XOR1 are eliminated from the configuration of the counter circuit 22 shown in FIG. 5, and the output signal of the flip flop FF1 is used as the signal qx.

As described above, according to the eighth embodiment, because both the AND circuit ANDX and the XOR circuit XOR1 are eliminated from the configuration of the counter circuit 22 shown in FIG. 5, the area of the test circuit can be reduced when compared with the test circuit,of the first embodiment shown in FIGS. 4 and 5.

Ninth Embodiment

Figure 21:
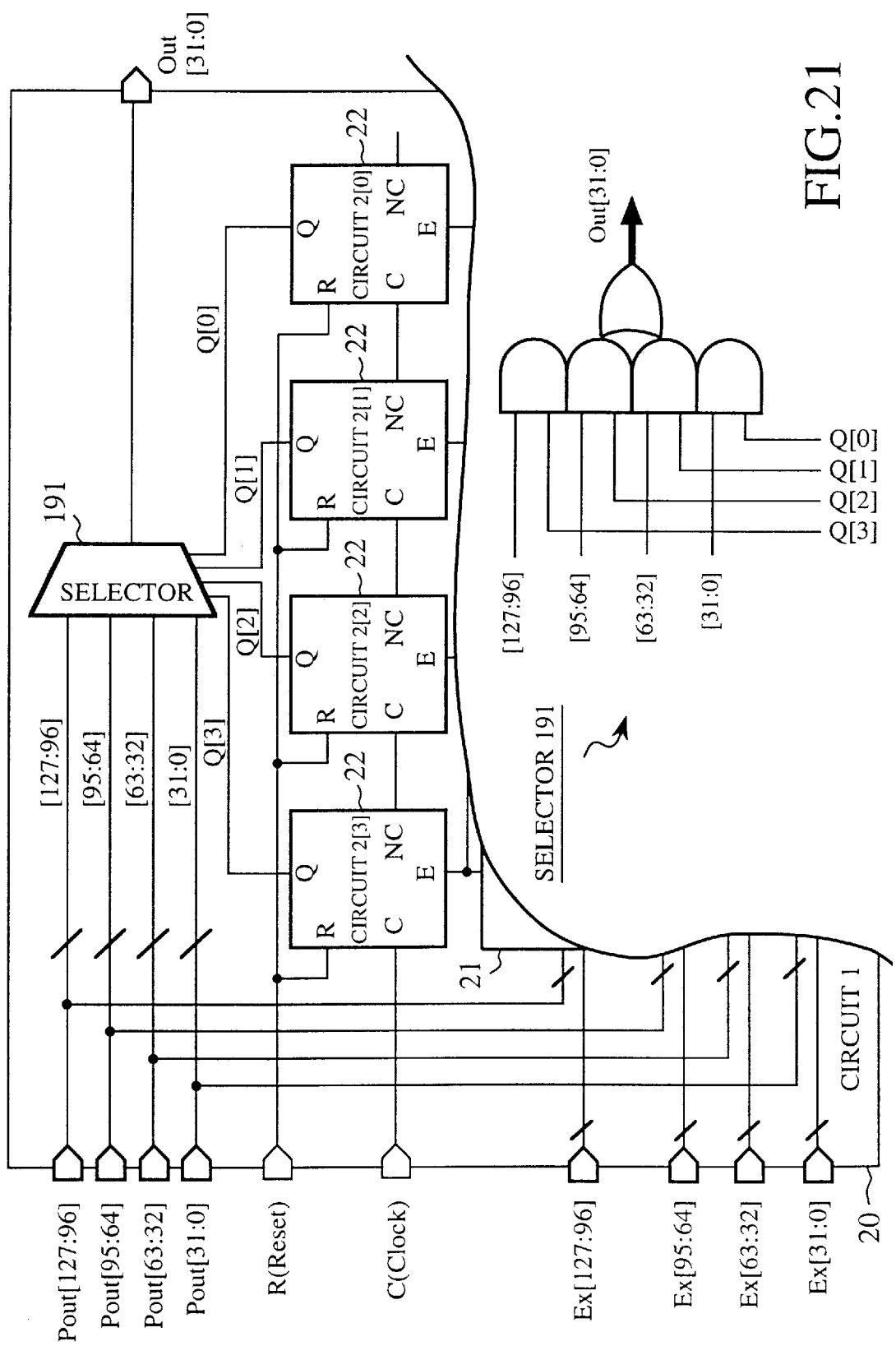
FIG. 21 is a circuit diagram showing a configuration of a test circuit for a semiconductor integrated circuit according to the ninth embodiment of the present invention.

FIG. 21 is a circuit diagram showing a configuration of the test circuit for a semiconductor integrated circuit according to the ninth embodiment of the present invention. In FIG. 21, the reference number 191 designates a selector comprising a plurality of logical gates. Other components in the test circuit according to the ninth embodiment are equal to those of the test circuit 20 according to the first embodiment, therefore the same reference characters and numbers are used for the same components and the explanation for the same components therefore is omitted here.

Next, a description will be given of the operation of the test circuit according to the ninth embodiment.

In the test circuit of the first embodiment shown in FIG. 4, the four tri state buffers 23 are incorporated. On the contrary, in the test circuit of the ninth embodiment, the selector 191 is incorporated instead of the four tri state buffers 23 of the test circuit 20 of the first embodiment. The configuration of the test circuit of the ninth embodiment can obtain the same effect of the test circuit of the first embodiment.

As described above, according to the ninth embodiment, because the selector 191 comprising a plurality of logical gates for selectively outputting the output data Pout from the object circuit 1 is incorporated in the test circuit, the test circuit of the ninth embodiment can obtain the same effect of the test circuit of the first embodiment.

Tenth Embodiment

Figure 22:
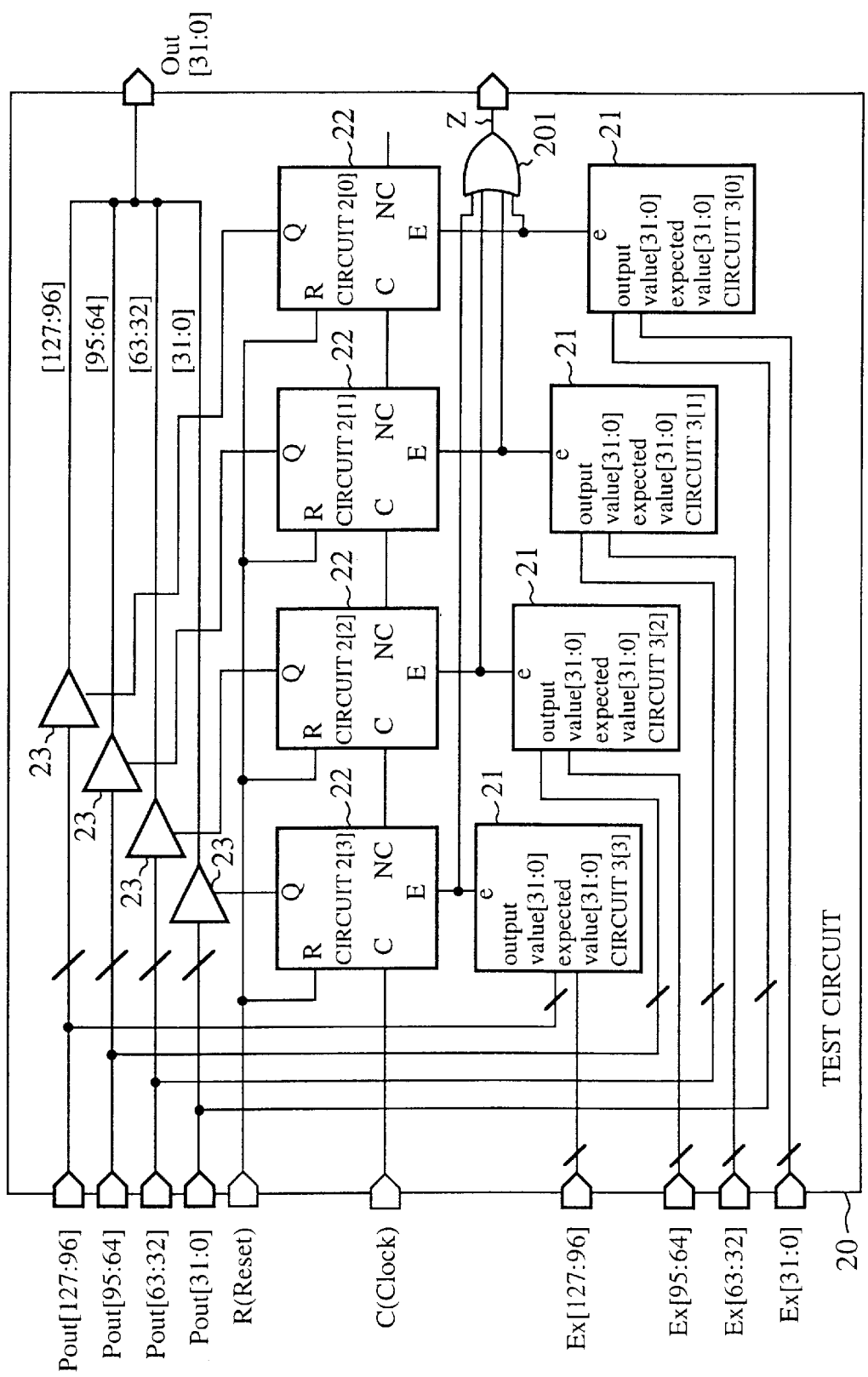
FIG. 22 is a circuit diagram showing a configuration of a test circuit for a semiconductor integrated circuit according to the tenth embodiment of the present invention.

FIG. 22 is a circuit diagram showing a configuration of the test circuit for a semiconductor integrated circuit according to the tenth embodiment of the present invention. In FIG. 22, the reference number 201 designates a logical circuit for inputting the signal e that indicates agreement/disagreement information transferred from each of the plural comparison circuits 21. For example, when the output data Pout from the object circuit 1 (shown in FIG. 4) are not equal to the expected data Ex, each of the comparison circuits 21 outputs the signal e of 1 (e=1) and thereby the logical circuit 201 outputs a control signal Z of 1 (Z=1). When the output data Pout from the object circuit 1 are completely equal to the expected data Ex, each of the comparison circuits 21 outputs a the signal e of zero (e=1) and thereby the logical circuit 201 outputs a control signal Z of zero (Z=0). Other components in the test circuit according to the tenth embodiment are equal to those of the test circuit 20 according to the first embodiment, therefore the same reference characters and numbers are used for the same components and the explanation for the same components therefore is omitted here.

Next, a description will be given of the operation of the test circuit according to the tenth embodiment.

The logical circuit 201 inputs the output signals e that indicate the comparison results between the output data Pout and the expected data Ex transferred from each of the comparison circuits 21. For example, in the comparison operation executed by each comparison circuit 21, all of the output data Pout are completely equal to the expected data Ex, the logical circuit 201 receives the signal e of zero (e=0) transferred from each of the comparison circuit 21 and outputs the control signal Z of zero (Z=0). On the contrary, even if only one bit in the output data Pout from the object circuit 1 is not equal to the corresponding bit in the expected data Ex, its comparison circuit 21 outputs the signal e of 1 (e=1) to the logical circuit 201. Thereby, the logical circuit 201 outputs the control signal Z of 1 (Z=1).

Accordingly, when the comparison results in the comparison circuits 21 indicate that the output data Pout are completely equal to the expected data Ex, it is not required to perform a resetting sequence operation for resetting the counter circuits 22. In this case, the operation of the resetting sequence operation can be eliminated. Thus, by referring the control signal Z transferred from the logical circuit 201 in the test circuit, the external tester.(not shown) or other control means for test can recognize whether the resetting sequence operation for the counter circuits 21 is required or not.

As described above according to the tenth embodiment, the test circuit shown in FIG. 22 further incorporates the logical circuit 201 that outputs to the outside the control signal Z for indicating whether or not the output data Pout are completely equal to the expected data EX. Thereby, by referring the value of the control signal Z transferred from the logical circuit 201, the control means for test such as the external tester can recognize the necessity of the resetting sequence operation for the counter circuits 22. In addition to the D effects of the first to ninth embodiments, it is possible to further reduce the test time because the resetting sequence operation is not required for the counter circuits 22 only when both the data Pout and Ex are completely equal.

As described above in detail, according to the present invention, because the test circuit for a semiconductor integrated circuit comprises comparison circuits for comparing output data from an object circuit for test with expected data per predetermined bits, and counter circuits and tri state buffer or a selector corresponding to comparison circuits, and because the test circuit outputs the test results having defect information to the outside such as an external tester in synchronization with a clock signal only when the output data from the object circuit are not equal to the expected data, the present invention has the effect to further reduce the test time when the output data from the object circuit are more in agreement with the expected data.

Furthermore, in each of the counter circuits in the test circuit according to the present invention, because signals having a same level are commonly used, and unnecessary AND circuit and XOR circuits are eliminated from the configuration of the counter circuit, and one or more inverters are incorporated instead of the eliminated AND circuits and XOR circuits, if necessary. Thereby, the present invention has the effect to further reduce the total area of the test circuit.

Moreover, because the test circuit according to the present invention further incorporates the logical circuit for generating the control signal to indicate that the output data from the object circuit are completely equal to the expected data, and the logical circuit outputs the generated control signal to the outside of the test circuit such as the external tester, the external tester can halt the execution of the resetting sequence operation for each counter circuit by referring the value of the control signal, the present invention has the effect to further reduce the test time.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A test circuit for a semiconductor integrated circuit, comprising:
   a plurality of comparison means for comparing test results transferred from an object circuit for operational test of said semiconductor integrated circuit with expected data that have been prepared in advance;
   a plurality of control means for generating a control signal that indicates whether or not said test results are outputted based on comparison results transferred from each of said plurality of comparison means; and
   a plurality of selection means for selecting a part of said test results based on said control signal transferred from said plurality of control means;
   wherein each of said plurality of comparison means, said plurality of control means, and said plurality of selection means are incorporated in said test circuit and each operate on a predetermined number of outputs from a total number of outputs from an object circuit and each of said plurality of control means generates said control signal based on said comparison result that indicates only when said test results are not equal to said expected data to make test time short, and outputs said generated control signal to said corresponding selection means in order to output said test results including information about where mismatch of output occurs to the outside.

2. A test circuit for a semiconductor integrated circuit according to claim 1, wherein each of said plurality of control means generates said control signal based on said comparison result transferred from said corresponding comparison means that indicates only when said test results corresponding to each control means are equal to said expected data and outputs said control signal to said selection means corresponding to said control means in order to output said test results to the outside.

3. A test circuit for a semiconductor integrated circuit according to claim 1,
   wherein output pins of a semiconductor chip on which said test circuit and said semiconductor integrated circuit are divided into predetermined parts, and
   wherein each of said plurality of comparison means, each of said plurality of control means, and each of said plurality of selection means are assigned to each part of said divided output pins.

4. A test circuit for a semiconductor integrated circuit according to claim 1, wherein each of said plurality of control means comprises a plurality of flip flops and a plurality of logical circuits for generating said control signal that indicates whether or not said test results are outputted to said outside based on said comparison result transferred from said corresponding comparison means and outputs said control signal to said corresponding selection means.

5. A test circuit for a semiconductor integrated circuit according to claim 4, wherein each of said plurality of flip flops operates based on a positive edge or a negative edge of a clock signal.

6. A test circuit for a semiconductor integrated circuit according to claim 4, wherein input and output signals each having a same level are used, and input and output signals each having an opposite level to each other are used through in inverter for inverting said level of said input and output signals having said opposite level in order to have a same level in said plurality of logical circuits making up each of said plurality of control means and in order to reduce the number of said logical circuits.

7. A test circuit for a semiconductor integrated circuit according to claim 1, wherein each of said plurality of control means is made up of a counter circuit comprising a plurality of flip flops and a plurality of logical circuits for generating said control signal that indicates whether or not said test results are outputted to said outside based on said comparison result transferred from said corresponding comparison means and outputs said control signal to said corresponding selection means.

8. A test circuit for a semiconductor integrated circuit according to claim 7, wherein each of said plurality of flip flops operates based on a positive edge or a negative edge of a clock signal.

9. A test circuit for a semiconductor integrated circuit according to claim 7, wherein input and output signals each having a same level are used, and input and output signals each having an opposite level to each other are used through in inverter for inverting said level of said input and output signals having said opposite level in order to have a same level in said plurality of logical circuits making up each of said plurality of control means and in order to reduce the number of said logical circuits.

10. A test circuit for a semiconductor integrated circuit according to claim 1, wherein each of said plurality of selection means comprises one of a tri state buffer and a selector.

11. A test circuit for a semiconductor integrated circuit according to claim 1, wherein each of said plurality of selection means comprises a tri state buffer operable based on a high enable state or a low enable state.

12. A test circuit for a semiconductor integrated circuit according to claim 1 further comprises a second selection means for generating a control signal that indicates only a case where said test results are completely equal to said expected data, and then outputs said generated control signal to outside.

* * * * *